(12) United States Patent
Aritome

(10) Patent No.: US 9,122,568 B2
(45) Date of Patent: Sep. 1, 2015

(54) SEMICONDUCTOR MEMORY DEVICE

(71) Applicant: SK hynix Inc., Icheon-si Gyeonggi-do (KR)

(72) Inventor: Seiichi Aritome, Seongnam-si, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

(21) Appl. No.: 13/834,251

(22) Filed: Mar. 15, 2013

(65) Prior Publication Data

US 2014/0189258 A1 Jul. 3, 2014

(30) Foreign Application Priority Data

Jan. 2, 2013 (KR) ................ 10-2013-0000208

(51) Int. Cl.
*G11C 16/04* (2006.01)
*G06F 12/00* (2006.01)

(52) U.S. Cl.
CPC ...................... *G06F 12/00* (2013.01)

(58) Field of Classification Search
CPC ................................... G06F 12/00
USPC ............... 365/185.11, 185.17, 185.18
See application file for complete search history.

(56) References Cited

U.S. PATENT DOCUMENTS

2014/0009997 A1 * 1/2014 Toda .......................... 365/148

FOREIGN PATENT DOCUMENTS

KR 1020100052597 A 5/2010

OTHER PUBLICATIONS

Seiichi Aritome, "Scaling Challenges beyond 1xnm DRAM and NAND Flash," Joint Rump at VLSI Symposium, Jun. 12, 2012, pp. 24, Honolulu, HI.

* cited by examiner

*Primary Examiner* — Hoai V Ho
(74) *Attorney, Agent, or Firm* — William Park & Associates Ltd.

(57) ABSTRACT

A semiconductor memory device includes a memory array including memory blocks stacked in a plurality of layers over a substrate, first lines coupling word lines of memory blocks arranged in even-numbered layers, and second lines coupling word lines of memory blocks arranged in odd-numbered layers.

19 Claims, 11 Drawing Sheets

SEMICONDUCTOR MEMORY DEVICE

CROSS-REFERENCE TO RELATED APPLICATION

This application claims priority from Korean Patent Application No. 10-2013-0000208, filed on Jan. 2, 2013, the contents of which are incorporated herein by reference in its entirety.

BACKGROUND

1. Technical Field

Various embodiments relate generally to a semiconductor memory device and, more particularly, to a semiconductor memory device including memory cells stacked in a direction perpendicular to a substrate.

2. Related Art

In order to increase data storage capacity, more memory cells are formed within a defined area. To make room for additional memory cells, size of memory cells have decreased. However, there are limitations in reducing the size of memory cells. Another method has been proposed, which provides a three-dimensional (3D) structured memory block (or memory string) where memory cells are stacked in a direction perpendicular to a surface of a semiconductor substrate. This 3D structured memory string may include a vertical channel formed of silicon. The vertical channel may be formed between a bit line and a common source line.

Recently, a method of forming even more 3D structured memory blocks within the defined area has been in demand, and a method of preventing deterioration of electrical characteristics caused thereby is also being sought.

BRIEF SUMMARY

A semiconductor memory device according to an embodiment of the present invention includes a memory array including memory blocks stacked in a plurality of layers over a substrate, first lines coupling word lines of memory blocks arranged in even-numbered layers, and second lines coupling word lines of memory blocks arranged in odd-numbered layers.

A semiconductor memory device according to another embodiment of the present invention includes a memory array including memory blocks stacked in a plurality of layers over a substrate, wherein word lines of memory blocks vertically arranged in even-numbered layers are coupled to each other, and word lines of memory blocks vertically arranged in odd-numbered layers are coupled to each other, and an operation circuit configured to apply operating voltages to the memory blocks for a data input/output operation of a selected memory block among the memory blocks.

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
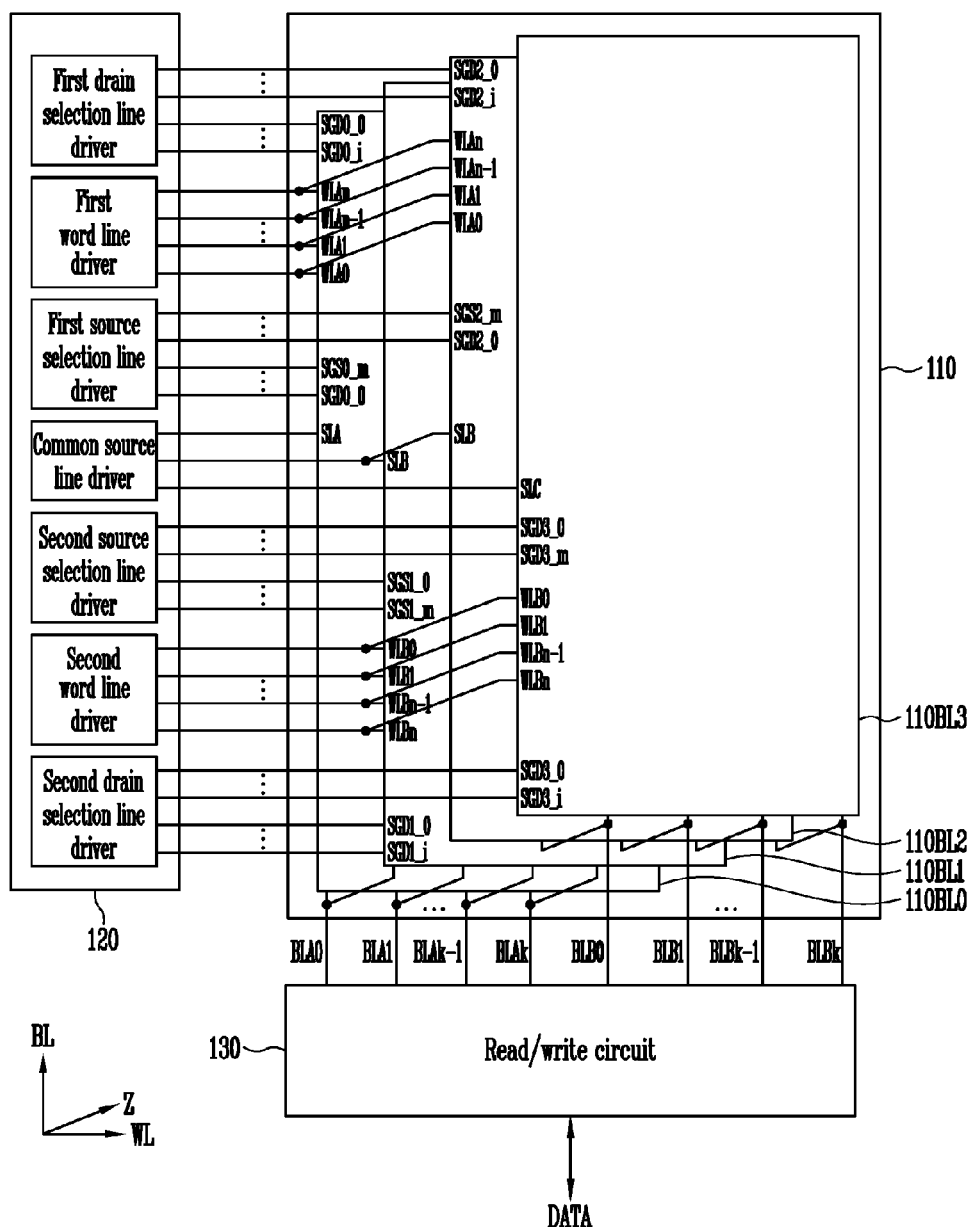
FIG. 1 is a block diagram of a semiconductor memory device according to an embodiment of the present invention.

Referring to FIG. 1, a semiconductor memory device may include a memory array 110 and operation circuits 120 and 130. The operation circuits may include an operating voltage apply circuit 120 and a read/write circuit 130.

The memory array 110 may include a plurality of memory block layers 110BL0 to 110BL3 that are stacked over a substrate. That is, the plurality of memory block layers are stack in a z direction in FIG. 1. Each of the memory block layers 110BL0 to 110BL3 may include a plurality of memory blocks that are horizontally arranged, and the memory blocks may be arranged in one direction (e.g., a bit line direction: BL). Each memory block may include a plurality of memory strings coupled between bit lines BLA0-BLAk and BLB0-BLBk, and common source lines SLA, SLB and SLC. The bit lines and the common source lines may be arranged in directions crossing each other in the memory block layers, respectively. The structure of each memory string may be described in detail below.

Figure 2:
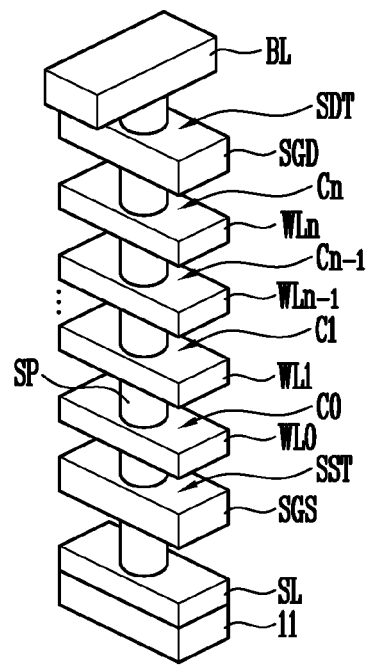
FIG. 2 is a three-dimensional view of a memory string included in a memory array of FIG. 1.
Figure 3:
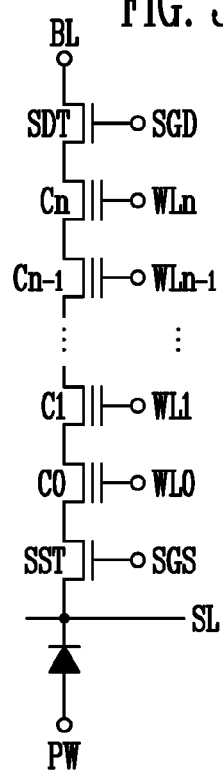
FIG. 3 is a circuit diagram of the memory string included in the memory array of FIG. 1.

Referring to FIGS. 2 and 3, a memory string may include a common source line SL, a vertical channel layer SP, a bit line BL and a plurality of conductive layers SGS, WL0 to WLn and SGD.

The common source line SL may be formed over a semiconductor substrate 11 in which a well (e.g., P well) PW may be formed. A diode D may be formed between the well and the common source line SL. The vertical channel layer SP may be formed on the common source line SL. The bit line BL may be coupled to a top surface of the vertical channel layer SP. The vertical channel layer SP may be formed of a semiconductor layer, for example, polysilicon. The plurality of conductive layers SGS, WL0 to WLn and SGD may be formed to surround the vertical channel layer SP at different heights. A multilayer (not illustrated) including a charge storage layer may be formed on a surface of the vertical channel layer SP. For example, the multilayer may also be disposed between the vertical channel layer SP and the conductive layers SGS, WL0 to WLn and SGD.

The lowermost conductive layer may be a source selection line (or first selection line) SGS, and the uppermost conductive layer may be a drain selection line (or second selection line) SGD. The other conductive layers between the source and drain selection lines SGS and SGD may be word lines WL0 to WLn. In other words, the conductive layers SGS, WL0 to WLn and SGD may be stacked in a plurality of layers over the semiconductor substrate 11, and the vertical channel layer SP passing through the conductive layers SGS, WL0 to WLn and SGD may be vertically coupled between the bit line BL and the source line SL formed over the semiconductor substrate 11.

A drain selection transistor (or second selection transistor) SDT may be formed at a position where the uppermost conductive layer SGD surrounds the vertical channel layer SP. A source selection transistor (or first selection transistor) SST may be formed at a position where the lowermost conductive layer SGS surrounds the vertical channel layer SP. Memory cells C0 to Cn may be formed at positions where intermediate conductive layers WL0 to WLn surround the vertical channel layer SP.

The memory string having the above-described structure may include the source selection transistor SST, the memory cells C0 to Cn and the drain selection transistor SDT that are electrically coupled in a direction perpendicular to a surface of the substrate 11 between the common source line SL and the bit line BL. The source selection transistor SST may electrically couple the memory cells C0 to Cn to the common source line SL in response to a first selection signal applied to a first selection line SGS. The drain selection transistor SDT may electrically couple the memory cells C0 to Cn to the bit line BL in response to a second selection signal applied to a second selection line SGD.

Figure 4:
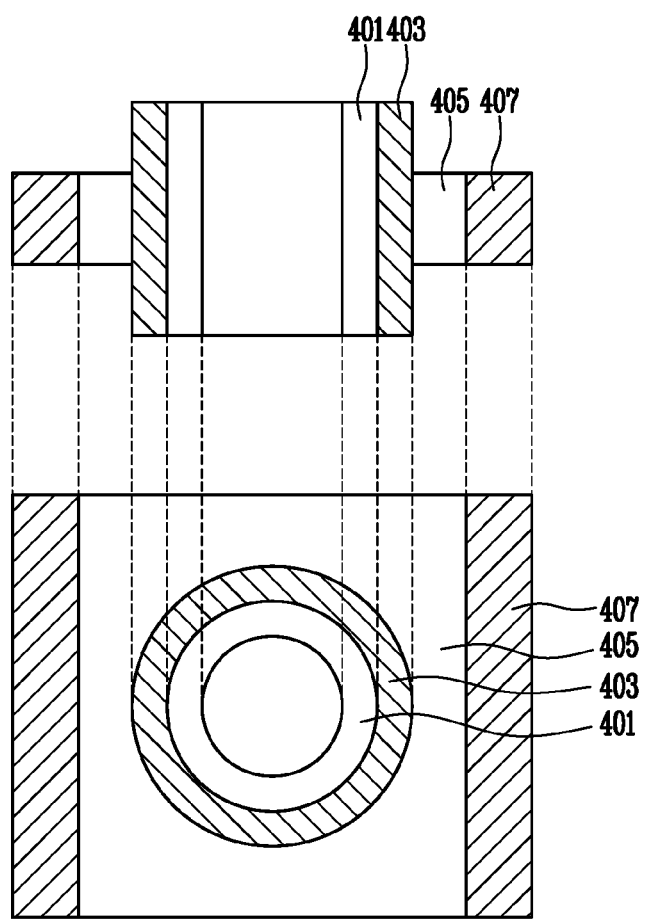
FIG. 4 is a view of a planar structure and a cross-sectional structure of a memory cell of the memory string of FIG. 2.

Referring to FIG. 4, a pipe channel layer 401 may include a semiconductor layer and have a hollow cylindrical shape. The pipe channel layer 401 may include a polysilicon layer including such impurities (e.g., 5-valence impurities) where the pipe channel 401 does not exhibit conductivity, or an undoped polysilicon layer including no impurities. A stacked layer 403 including a charge storage layer may surround the pipe channel layer 401. The stacked layer 403 may have a stacked structure of a tunnel insulating layer (not illustrated), a charge storage layer (not illustrated) and a blocking insulating layer (not illustrated). The tunnel insulating layer may include an oxide layer, the charge storage layer may include a nitride layer, and the blocking insulating layer may include an oxide layer or a high-k dielectric insulating layer with a higher dielectric constant than that of a nitride layer. The tunnel insulating layer may be interposed between the charge storage layer and the pipe channel layer 401. The conductive layers may surround the pipe channel layer 401 at different heights. For example, a conductive layer configured as a word line may include a polysilicon layer 405, and an outer wall of the conductive layer may be formed of metal silicide 407. The stacked layer 403 may be interposed between the pipe channel layer 401 and the word line (405 and 407). As result, the word line 405 and 407 may be configured to surround the pipe channel layer 401 and the stacked layer 403 which are substantially cylindrical shaped.

Figure 5:
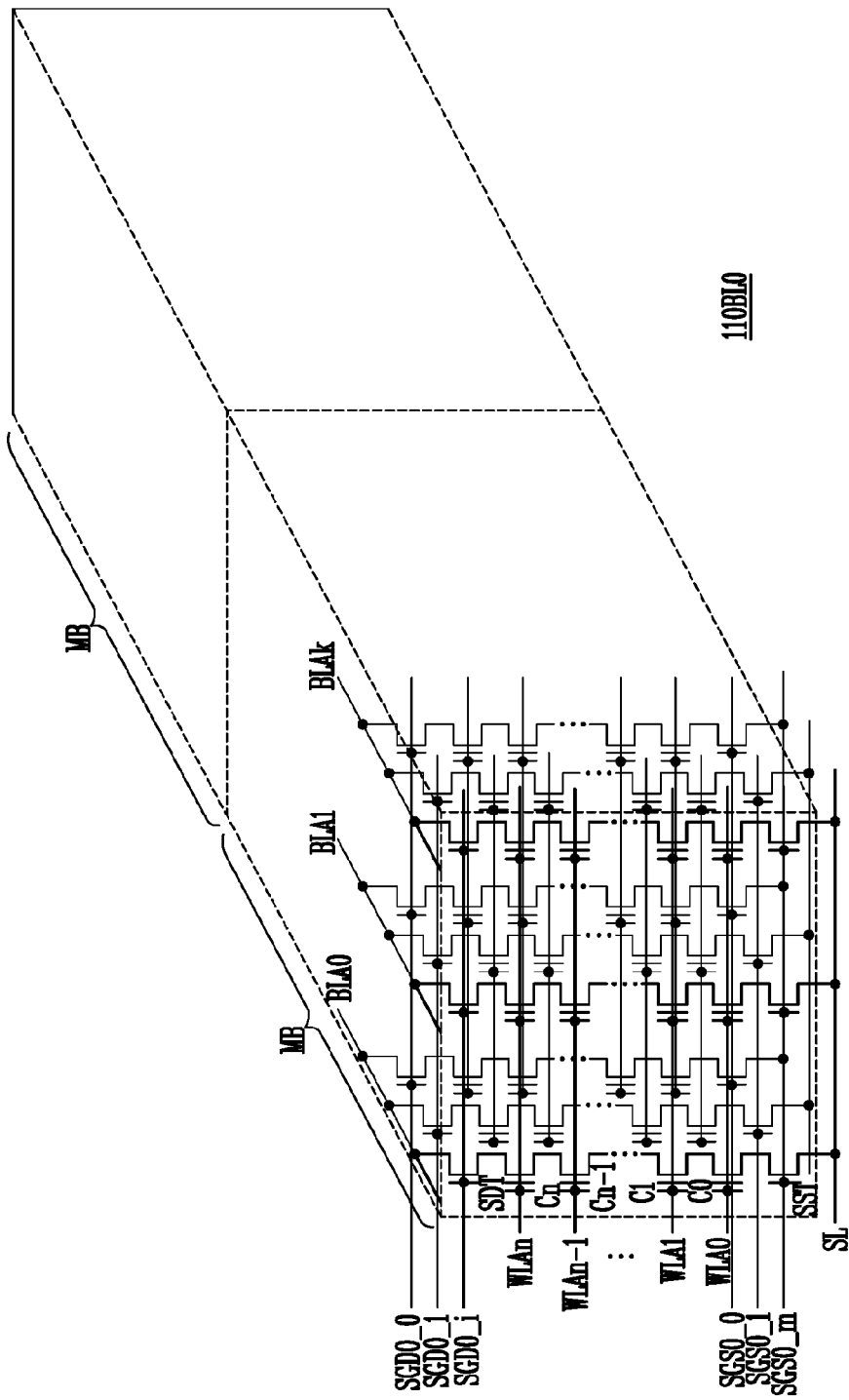
FIG. 5 is a circuit diagram of a memory block layer included in the memory array of FIG. 1.

Referring to FIG. 5, the memory block layer 110BL0 may include a plurality of memory blocks MB arranged in a direction horizontal to the substrate. Here, two memory block MB are depicted for illustration purposes. Each of the memory blocks MB may include memory strings coupled between bit lines BLA0 to BLAk and common source lines SL. Here, three bit lines are depicted for illustration purposes. The memory blocks MB in the memory block layer 110BL0 may share each of the bit lines BLA0 to BLAk, and the common source lines SL of the memory blocks MB may be separated from each other. The bit lines BLA0 to BLAk may extend in a direction parallel to the direction in which the memory blocks MB are horizontally arranged.

A plurality of memory strings may be coupled to each of the bit lines BLA0 to BLAk in each memory block MB, and a plurality of memory strings may be coupled to each of the common source lines SL. Each of the memory strings may include the first selection transistor (or source selection transistor) SST coupled to the common source line SL, the second selection transistor (or drain selection transistor) SDT coupled to the bit line BLA0, and the memory cells C0 to Cn coupled between the first and second selection transistors SST and SDT, in series.

The memory cells C0 to Cn included in each memory string in the memory block MB may share word lines WLA0 to WLAn. More specifically, the word lines WLA0 to WLAn of the memory cells C0 to Cn included in each memory string may be coupled to each other. In other words, in the memory block MB, word lines of memory cells formed in the same layer and horizontally adjacent to each other may be coupled to each other.

Drain selection transistors SDT of the memory strings coupled to different bit lines BLA0 to BLAk, respectively, in the memory block MB may share the same drain selection line, for example, a drain selection line SGD0_0. In other words, gates of the drain selection transistors SDT of the memory strings coupled to the bit lines BLA0 to BLAk, respectively, may be coupled to a single drain selection line, for example, the drain selection line SGD0_0. On the other hand, the drain selection transistors SDT of the memory strings coupled to the same bit line, for example, the bit line BLA0 in the memory block MB, may have different drain selection lines SGD0_0 to SGD0_$i$. In other words, the drain selection lines SGD0_0 to SGD0_$i$ of the drain selection transistors SDT of the memory strings coupled to the bit line BLA0 may be separated from each other. Therefore, the drain selection transistors SDT coupled to the bit line BLA0 may be independently operated at different operating voltages. The drain selection lines SGD0_0 to SGD0_$i$ may extend in a direction crossing the bit lines BLA0 to BLAk.

In the memory block MB, source selection transistors SST of the memory string coupled to different bit lines BLA0 to BLAk, respectively, may share the same source selection line SGS0_0 to SGS0_$m$, for example, a source selection line SGS0_0. In other words, gates of the source selection transistors SST of the memory strings coupled to the bit lines BLA0 to BLAk, respectively, may be coupled to a single source selection line SGS0_0 to SGS0_$m$, for example, the source selection line SGS0_0. However, the source selection transistors SST of the memory strings coupled to the same bit line, for example, the bit line BLA0, may have different source selection lines SGS0_0 to SGS0_$m$. In other words, the source selection lines SGS0_0 to SGS0_$m$ of the source selection transistors SST of the memory strings coupled to the bit line BLA0 may be separated from each other. Therefore, the source selection transistors SST coupled to the bit line BLA0 may be independently operated at different operating voltages. The source selection lines SGS0_0 to SGS0_$m$ may extend in a direction crossing the bit lines BLA0 to BLAk. On the other hand, all of the source selection lines SGS0_0 to SGS0_$m$ in the memory block MB may be coupled to each other.

The memory strings in the memory block MB may be coupled to the one common source line SL, or the common source line SL may be separated into a plurality of lines in substantially the same or similar manner as in the source selection lines SGS0_0 to SGS0_*m*.

Operating voltages to be applied to the memory blocks MB during a read operation, a program operation and an erase operation may vary depending on whether or not the source selection lines SGS0_0 to SGS0_*m* are coupled to each other and the common source lines SL are separated from each other in the memory block MB.

The memory blocks MB in the memory block layer 110BL0 may be configured to include the plurality of source selection lines SGS0_0 to SGS0_*m* which are electrically isolated from one another, the plurality of word lines WLA0 to WLAn which are electrically isolated from one another, the plurality of drain selection lines SGD0_0 to SGD0_*i* which are electrically isolated from one another, and the plurality of common source lines SL which are electrically isolated from one another. In other words, the source selection lines SGS0_0 to SGS0_*m*, the word lines WLA0 to WLAn, the drain selection lines SGD0_0 to SGD0_*i* and the common source lines SL of the memory blocks MB in the memory block layer 110BL0 may be arranged in parallel to be separate from one another.

Figure 6:
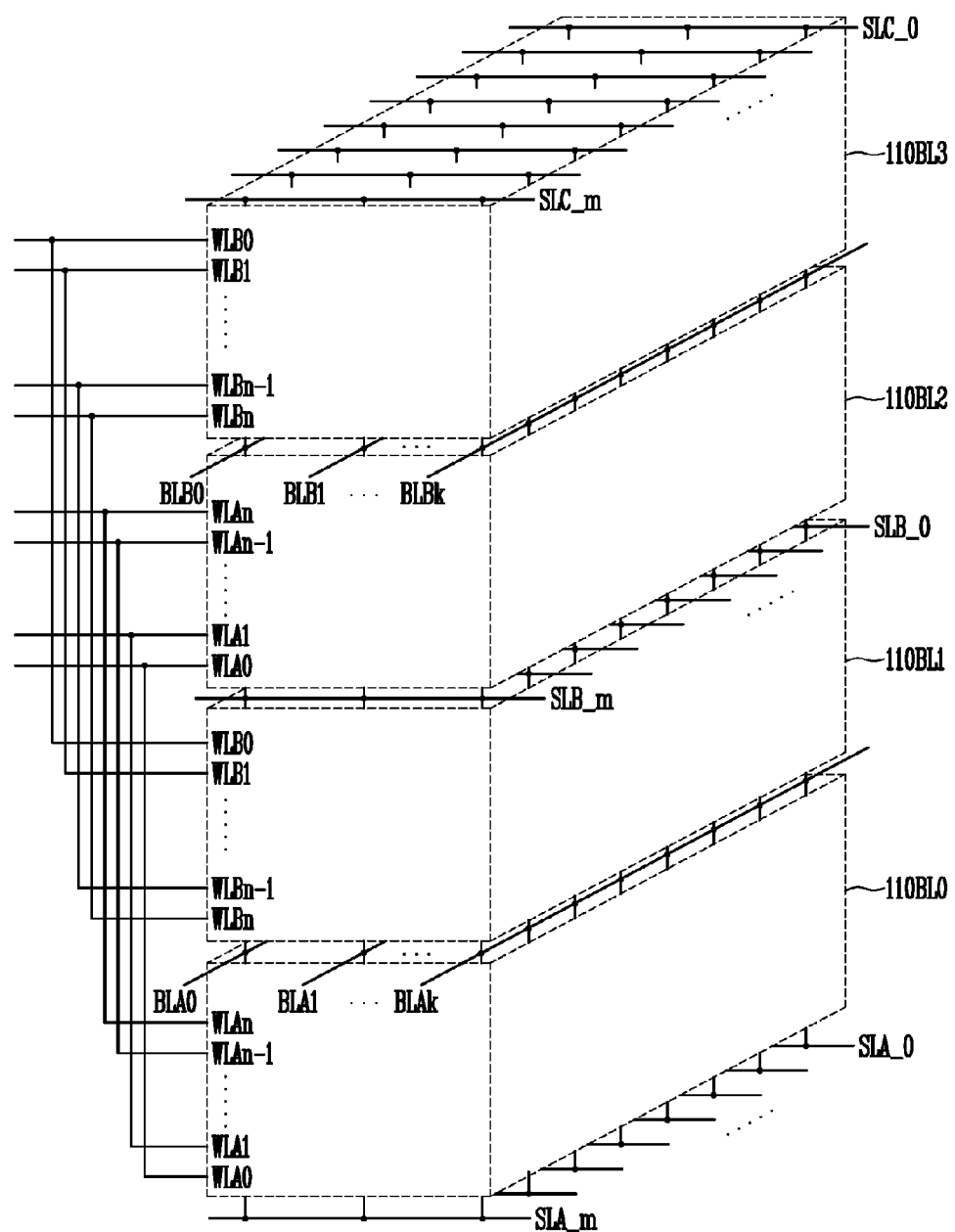
FIG. 6 is a block diagram of the memory array of FIG. 1.

Referring to FIG. 6, two or more of the memory block layers 110BL0 to 110BL3 described with reference to FIG. 5 may be stacked. Memory blocks (or memory strings) included in an odd-numbered memory block layer 110BL0 or 110BL2 and memory blocks (or memory strings) included in an even-numbered memory block layer 110BL1 or 110BL3 may share bit lines BLA0 to BLAk or BLB0 to BLBk, or common source lines SLB_0 to SLB_m.

More specifically, the odd-numbered memory block layer 110BL2 may share the bit lines BLB0 to BLBk with the even-numbered memory block layer 110BL3 stacked thereabove and may share the common source lines SLB_0 to SLB_m with the even-numbered memory block layer 110BL1 stacked therebelow. In addition, the even-numbered memory block layer 110BL1 may share the common source lines SLB_0 to SLB_m with the odd-numbered memory block layer 110BL2 stacked thereabove and may share the bit lines BLA0 to BLAk with the odd-numbered memory block layer 110BL0 stacked therebelow. To this end, the bit lines BLA0 to BLAk and the bit lines BLB0 to BLBk may be formed in different layers, and common source lines SLA_0 to SLA_m, SLB_0 to SLB_m and SLC_0 to SLC_m may be formed in different layers.

The memory blocks may be stacked in such a manner that the memory block included in the odd-numbered memory block layer 110BL0 and the memory block included in the even-numbered memory block layer 110BL1 may be stacked with vertical symmetry.

The odd-numbered memory block layers 110BL0 and 110BL2 may share the word lines WLA0 to WLAn. In other words, the word lines WLA0 to WLAn of the memory blocks included in the odd-numbered memory block layers 110BL0 and 110BL2 may be coupled to each other. More specifically, the word lines WLA0 to WLAn of the memory blocks included in the lower odd-numbered memory block layer 110BL0 may be coupled to the word lines WLA0 to WLAn included in the memory blocks in the upper odd-numbered memory block layer 110BL2. In substantially the same or similar manner, the even-numbered memory block layers 110BL1 and 110BL3 may share the word lines WLB0 to WLBn. In other words, the word lines WLB0 to WLBn of the memory blocks included in the lower even-numbered memory block layer 110BL1 may be coupled to the word lines WLB0 to WLBn of the memory blocks included in the upper even-numbered memory block layer 110BL3.

Since the word lines WLA0 to WLAn of the memory blocks included in the odd-numbered memory block layers 110BL0 and 110BL2 are coupled to each other, and the word lines WLB0 to WLBn of the memory block layers 110BL1 and 110BL3 included in the even-numbered memory block layers 110BL1 and 110BL3 are coupled to each other, read disturbance, program disturbance and erase disturbance phenomenons may be improved. Embodiments for improving these disturbance phenomenons will be described below with reference to FIGS. 7 to 10.

Referring again to FIG. 1, the operating voltage apply circuit 120 may be configured to apply operating voltages to a selected memory block, among the memory blocks, for a data input/output operation such as a read operation, a program operation or an erase operation.

Basically, the operating voltage apply circuit 120 may apply a read voltage to word lines (selected word lines) of selected memory cells and a read pass voltage to word lines (unselected word lines) of unselected memory cells during a read operation. In addition, the operating voltage apply circuit 120 may apply a program voltage to the word lines (selected word lines) of the selected memory cells and a program pass voltage to the word lines (unselected word lines) of the unselected memory cells during a program operation. The operating voltage apply circuit 120 may apply a negative voltage of, for example, −10V to the word lines WL0 to WLn of the memory cells during an erase operation.

Since the memory blocks included in the odd-numbered memory block layers 110BL0 and 110BL2 share the word lines WLA0 to WLAn, and the memory blocks included in the even-numbered memory block layers 110BL1 and 110BL3 share the word lines WLB0 to WLBn, the operating voltage apply circuit 120 may apply a voltage for suppressing a disturbance phenomenon (e.g., ground voltage) to selected word lines (e.g., WLA0 to WLAn) when applying the operating voltages for the data input/output operation to unselected word lines (e.g., WLB0 to WLBn). Voltages applied to the selected memory block through the bit lines BLA0 to BLAk or BLB0 to BLBk may be applied to an upper or lower memory block based on corresponding bit lines BLA0 to BLAk or BLB0 to BLBk. Voltages applied to the selected memory block through the common source lines SLB_0 to SLB_m may also be applied to an upper or lower memory block based on corresponding common source lines SLB_0 to SLB_m. Further the operating voltages applied to the selected memory block through the word lines WLA0 to WLAn or WLB0 to WLBn may be applied to an unselected memory block sharing the word lines WLA0 to WLAn or WLB0 to WLBn. Therefore, the operating voltage apply circuit 120 should be able to independently control operating voltages that are to be applied to drain selection lines SGD0_0 to SGD0_*i*, SGD1_0 to SGD1_*i*, SGD2_0 to SGD2_*i* and SGD3_0 to SGD3_*i*, independently control operating voltages that are to be applied to source selection lines SGS0_0 to SGS_*i*, SGS1_0 to SGS1_*i*, SGS2_0 to SGS2_*i* and SGS3_0 to SGS3_*i* and independently control operating voltages that are to be applied to common source lines SLA, SLB and SLC in each memory block layer.

To this end, the operating voltage apply circuit 120 may include a first drain selection line driver, a first word line driver, a first source selection line driver, a common source line driver, a second drain selection line driver, a second word line driver and a second source selection line driver. The first word line driver may control voltages applied to the word lines WLA0 to WLAn, which are shared by the odd-numbered memory block layers 110BL0 and 110BL2, in order to perform a read operation, a program operation and an erase operation of the odd-numbered memory block layers 110BL0 and 110BL2. The first drain selection line driver may control voltages applied to the drain selection lines SGD0_0 to SGD0_$i$ and SGD2_0 to SGD2_$i$ of the memory blocks included in the odd-numbered memory block layers 110BL0 and 110BL2. The first source selection line driver may control voltages applied to the source selection lines SGS0_0 to SGS0_$m$ and SGS2_0 to SGS2_$m$ of the memory blocks included in the odd-numbered memory block layers 110BL0 and 110BL2.

The common source line driver may control voltages applied to the common source lines SLA, SLB and SLC of the memory blocks included in the memory block layers 110BL0 to 110BL3. The second word line driver may control voltages applied to the word lines WLB0 to WLBn, which are shared by the even-numbered memory block layers 110BL1 and 110BL3, in order to perform a read operation, a program operation and an erase operation of the even-numbered memory block layers 110BL1 and 110BL3. The second drain selection line driver may control voltages applied to the drain selection lines SGD1_0 to SGD1_$i$ and SGD3_0 to SGD3_$i$ of the memory blocks included in the even-numbered memory block layers 110BL1 and 110BL3. The second source selection line driver may control the voltages applied to the source selection lines SGS1_0 to SGS1_$m$ and SGS3_0 to SGS3_$m$ of the memory blocks included in the even-numbered memory block layers 110BL1 and 110BL3. Voltage applying conditions will be described below in detail through various embodiments.

The read/write circuit 130 may be coupled to the memory blocks included in the odd numbered memory block layers 110BL0 and 110BL2 through the bit lines BLA0 to BLAk and may be coupled to the memory blocks included in the even-numbered memory block layers 110BL1 to 110BL3 through the bit lines BLB0 to BLBk. In addition, the read/write circuit 130 may selectively precharge or discharge selected bit lines (BLA0 to BLAk or BLB0 to BLBk) in response to data stored in the memory cells during a program operation, or may latch the data stored in the memory cells by sensing changes in voltages (or currents) of the selected bit lines BLA0 to BLAk or BLB0 to BLBk during a read operation. The read/write circuit 130 may include a page buffer.

The read/write circuit 130 may control voltages applied to unselected bit lines (BLB0 to BLBk or BLA0 to BLAk) in order to improve the disturbance phenomenon of the memory blocks located above and below the selected memory block. Voltage applying conditions will be described in detail below through various embodiments.

As described above, the operating voltages applied to the memory blocks during the read operation, the program operation and the erase operation may vary according to connecting figures of the source selection lines SGS0_0 to SGS0_$i$ and the common source lines SLA, SLB and SLC. This will be described below in detail.

Figure 7:
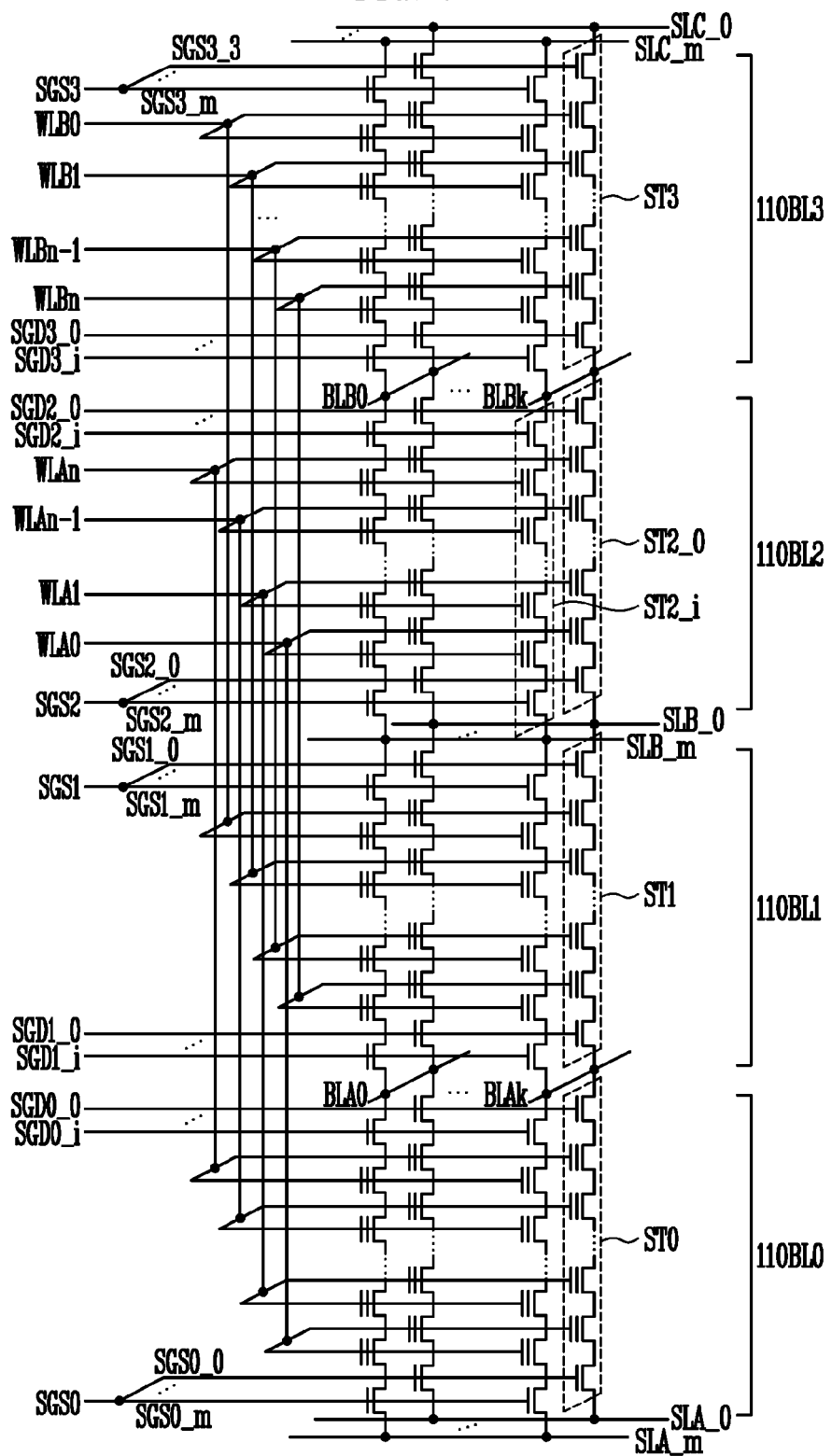
FIG. 7 is a circuit diagram illustrating the structure and operations of a memory array according to an embodiment.

FIG. 7 illustrates first to fifth strings ST0, ST1, ST2_0, ST3 and ST2_$i$ that are included in the first to fourth memory block layers 110BL0 to 110BL3. The third memory string ST2_0 may be a selected memory string, among strings included in a selected memory block, in the third memory block layer 110BL2.

For example, the fifth memory string ST2_$i$ may be an unselected memory string that shares the bit line BLBk and the word lines WLA0 to WLAn with the third memory string ST2_0 in the selected memory block of the third memory block layer 110BL2. The drain selection lines SGD2_0 and SGD2_$i$ of the third memory string ST2_0 and the fifth memory string ST2_$i$ may be electrically separated from each other.

The second memory string ST1 may be an unselected memory string included in a memory block sharing common source lines SLB_0 to SLB_m with the selected memory block of the third memory block layer 110B2, among memory blocks included in the second memory block layer 110BL1. In other words, the second memory string ST1 may share the common source line SLB_0 to SLB_m with the selected memory string ST2_0 and be adjacent to the bottom thereof.

The fourth memory string ST3 may be an unselected memory string included in a memory block sharing the bit lines BLB0 to BLBk with the selected memory block in the third memory block layer 110BL2, among memory blocks of the fourth memory block layer 110BL3. In other words, the fourth memory string ST3 may share the bit lines BLB0 to BLBk with the selected memory string ST2_0 and be adjacent to the top thereof.

The first memory string ST0 may be an unselected memory string included in the first memory block layer 110BL0 and share the word lines WLA0 to WLAn with the third memory string ST2_0.

The above-described first to fifth memory strings ST0, ST1, ST2_0, ST3 and ST2_$i$ may also be applicable to embodiments described with reference to FIGS. 8 to 10.

Common source lines (e.g., SLB_0 to SLB_m) in each memory block may be electrically separated from one another. The memory strings ST2_0 to ST2_$i$ coupled to the same bit line, for example, the bit line BLB0, may be coupled to different common source lines SLB_0 to SLB_m, respectively. In addition, the memory strings coupled to the bit lines BLB0 to BLBk may be coupled to the same common source line.

Source selection lines SGS0_0 to SGS0_$m$ may be coupled to the source selection line SGS0. Source selection lines SGS1_0 to SGS1_$m$ may be coupled to source selection line SGS1, and source selection lines SGS2_0 to SGS2_$m$ may be coupled to source selection lines SGS2. Source selection lines SGS3_0 to SGS3_$m$ may be coupled to source selection line SGS3.

Though not shown in FIG. 7, the source selection lines SGS0_0 to SGS0_$m$ and SGS2_0 to SGS2_$m$ of the memory blocks arranged in odd-numbered memory block layers 110BL0 and 110BL2 may be coupled to each other, and the source selection lines SGS1_0 to SGS1_$m$ and SGS3_0 to SGS3_$m$ of the memory blocks arranged in even-numbered memory block layers 110BL1 and 110BL3 may be coupled to each other.

During a read operation, a program operation and an erase operation of the memory cells included in the selected memory string ST2_0, in order to improve the disturbance phenomenon of unselected memory blocks, the operation circuit (reference numerals 120 and 130 in FIG. 1) may apply operating voltages to memory blocks as shown in Table 1 below.

TABLE 1

| | | | Read | Program | Erase | | | Read | Program | Erase |
|---|---|---|---|---|---|---|---|---|---|---|
| memory string(ST3) of 4$^{th}$ layer | (sharing WL with ST1) | BLBk | 1 V | Vcc->0 V/Vcc | Floating | 4$^{th}$ layer unselected | BLBk | 1 V | 0 V/Vcc | Floating |
| | (Sharing BL) | SGD3_0 | 0 V | 0 V | 0 V | M/B | SGD3_0' | 0 V | 0 V | 0 V |

TABLE 1-continued

|  |  |  | Read | Program | Erase |  |  | Read | Program | Erase |
|---|---|---|---|---|---|---|---|---|---|---|
| memory block | with ST2_0) |  |  | or −2 V |  | (Sharing BL with ST2_0) |  |  | or −2 V |  |
|  |  | WLBn | 0 V | 0 V | 0 V |  | WLBn' | 0 V | 0 V | 0 V |
|  |  | ... | 0 V | 0 V | 0 V |  | ... | 0 V | 0 V | 0 V |
|  |  | WLB | 0 V | 0 V | 0 V |  | WLB' | 0 V | 0 V | 0 V |
|  |  | ... | 0 V | 0 V | 0 V |  | ... | 0 V | 0 V | 0 V |
|  |  | WLB0 | 0 V | 0 V | 0 V |  | WLB0 | 0 V | 0 V | 0 V |
|  |  | SGS3 | 0 V | 0 V | Verase(8 V) |  | SGS3' | 0 V | 0 V | 0 V |
|  |  |  |  | or −2 V |  |  |  |  |  |  |
|  |  | SLC_0 | 0 V | Vcc | 0 V |  | SLC_0' | 0 V | 0 V | 0 V |
| memory string(ST2_0) of $3^{rd}$ layer memory block | (selected) | BLBk | 1 V | Vcc−>0 V/ Vcc | Floating | $3^{rd}$ layer unselected M/B (sharing BL with ST2-0) | BLBk | 1 V | 0 V/Vcc | Floating |
|  |  | SGD2_0 | 4 V | 5 V−>1.5 V | 0 V |  | SGD2_0' | 0 V | 0 V or −2 V | 0 V |
|  |  | WLAn | Vpass_read | Vpass_pgm | −10 V |  | WLAn' | 0 V | 0 V | 0 V |
|  |  | ... | Vpass_read | Vpass_pgm | −10 V |  | ... | 0 V | 0 V | 0 V |
|  |  | SEL_WLA | Vread | Vpgm | −10 V |  | WLA' | 0 V | 0 V | 0 V |
|  |  | ... | Vpass_read | Vpass_pgm | −10 V |  | ... | 0 V | 0 V | 0 V |
|  |  | WLA0 | Vpass_read | Vpass_pgm | −10 V |  | WLA0' | 0 V | 0 V | 0 V |
|  |  | SGS2 | 4 V | 0 V or −2 V | Verase(8 V) |  | SGS2' | 0 V | 0 V | 0 V |
|  |  | SLB_0 | 0 V | Vcc | Verase(8 V) |  | SLB_0' | 0 V | 0 V | 0 V |
| memory string(ST1) of $2^{nd}$ layer memory block | (sharing BL with ST0) (Sharing SL with ST2_0) (sharing WL with ST3) | BLAk | 0 V | Vcc | Floating | $2^{nd}$ layer unselected M/B | BLAk | 0 V | 0 V | Floating |
|  |  | SGD1_0 | 0 V | 0 V or −2 V | 0 V |  | SGD1_0' | 0 V | 0 V or −2 V | 0 V |
|  |  | WLBn | 0 V | 0 V | 0 V |  | WLBn' | 0 V | 0 V | 0 V |
|  |  | ... | 0 V | 0 V | 0 V |  | ... | 0 V | 0 V | 0 V |
|  |  | WLB | 0 V | 0 V | 0 V |  | WLB' | 0 V | 0 V | 0 V |
|  |  | ... | 0 V | 0 V | 0 V |  | ... | 0 V | 0 V | 0 V |
|  |  | WLB0 | 0 V | 0 V | 0 V |  | WLB0' | 0 V | 0 V | 0 V |
|  |  | SGS1 | 0 V | 0 V or −2 V | Verase(8 V) |  | SGS1' | 0 V | 0 V | 0 V |
|  |  | SLB_0 | 0 V | Vcc | Verase(8 V) |  | SLB_0' | 0 V | 0 V | 0 V |
| Memory string(ST0) of $1^{st}$ layer memory block | (Sharing WL with ST2_0) (sharing BL with ST1) | BLAk | 0 V | Vcc | Floating | $1^{st}$ layer unselected M/B | BLAk | 0 V | 0 V | Floating |
|  |  | SGD0_0 | 0 V | 5 V−>0 V or −2 V | 0 V |  | SGD0_0' | 0 V | 0 V or −2 V | 0 V |
|  |  | WLAn | Vpass_read | Vpass_pgm | −10 V |  | WLAn' | 0 V | 0 V | 0 V |
|  |  | ... | Vpass_read | Vpass_pgm | −10 V |  | ... | 0 V | 0 V | 0 V |
|  |  | WLA | Vread | Vpgm | −10 V |  | WLA' | 0 V | 0 V | 0 V |
|  |  | ... | Vpass_read | Vpass_pgm | −10 V |  | ... | 0 V | 0 V | 0 V |
|  |  | WLA0 | Vpass_read | Vpass_pgm | −10 V |  | WLA0' | 0 V | 0 V | 0 V |
|  |  | SGS0 | 4 V | 0 V or −2 V | Verase(8 V) |  | SGS0' | 0 V | 0 V | 0 V |
|  |  | SLA_0 | Vcc | Vcc | 0 V |  | SLA_0' | 0 V | 0 V | 0 V |
| memory string(ST2_i) of $3^{rd}$ layer memory block | (sharing WL with ST0) (Sharing BL&WL with ST2_0) | BLBk | 1 V | Vcc−>0 V/ Vcc | Floating |  |  |  |  |  |
|  |  | SGD2_i | 0 V | 5 V−>0 V or −2 V | 0 V |  |  |  |  |  |
|  |  | WLAn | Vpass_read | Vpass_pgm | −10 V |  |  |  |  |  |
|  |  | ... | Vpass_read | Vpass_pgm | −10 V |  |  |  |  |  |
|  |  | SEL_WLA | Vread | Vpgm | −10 V |  |  |  |  |  |
|  |  | ... | Vpass_read | Vpass_pgm | −10 V |  |  |  |  |  |
|  |  | WLA0 | Vpass_read | Vpass_pgm | −10 V |  |  |  |  |  |
|  |  | SGS2 | 4 V | 0 V or −2 V | Verase(8 V) |  |  |  |  |  |
|  |  | SLB_m | 0 V | Vcc | Verase(8 V) |  |  |  |  |  |

Voltage applying conditions as shown in Table 1 above are described in detail. During the read operation of the selected memory block including the selected memory string ST2_0, the operation circuit may apply a precharge voltage of, for example, 1V to the bit line BLBk, apply a ground voltage to the common source line SLB, apply a voltage of, for example, 4V to the drain selection line SGD2_0 in order to turn on the drain selection transistor, and apply a voltage of, for example, 4V to the source selection line SGS2 in order to turn on a source selection transistor. Subsequently, when a read voltage Vread is applied to a selected word line SEL_WLA and a read pass voltage Vpass_read is applied to unselected word lines, through the operation circuit, for example, the operating voltage apply circuit 120, a voltage level of the bit line BLBk may be reduced or maintained according to a threshold voltage of a memory cell coupled to the selected word line SEL_WLA. The operation circuit, for example, the read/write circuit 130 may sense a change in the voltage level of the bit line BLBk, latch data stored in the memory cell and output the latched data. The above-described read operation may also be applicable to a read operation described with reference to FIGS. 8 to 10.

During the program operation of the selected memory block, the operation circuit 120 and 130 may apply a precharge voltage of, for example, 1V to the bit line BLBk in response to data to be stored in the memory cell, or may apply and discharge the precharge voltage after precharging of the bit line BLBk is completed. The operation circuit 120 and 130 may apply a power voltage (e.g., Vcc) to the common source line SLB and may apply a high voltage of, for example 5V, to the drain selection line SGD2_0 when precharging the bit line BLBk and apply a voltage of, for example, 1.5V having a normal level after the bit line BLBk is completely precharged. The operation circuit 120 and 130 may apply a ground voltage or a negative voltage of, for example, −2V to the source selection line SGS2. In addition, when the operation circuit 120 and 130 applies a program voltage Vpgm to the selected word line SEL_WLA and applies a program pass voltage Vpass_pgm to the unselected word lines, a level of the threshold voltage of the memory cell coupled to the selected word line SEL_WLA may increase or be maintained according to a discharge state or a precharge state of the bit line BLBk. Subsequently, the operation circuit 120 and 130 may perform a program verify operation to detect whether the threshold voltage level of the memory cell has increased to a target level. The above-described program operation may also be applicable to a program operation described with reference to FIGS. 8 to 10.

During the erase operation of the selected memory block, the operation circuit 120 and 130 may set the bit line BLBk to include a floating state and may apply a positive voltage of, for example, 8V corresponding to an erase voltage Verase to the common source line SLB. Here, the erase voltage Verase may be applied to channels of the memory cells included in the selected memory block in order to perform the erase operation. In addition, the operation circuit 120 and 130 may applied to a ground voltage of, for example, 0V to the drain selection line SGD2_0 and apply a positive voltage corresponding to the erase voltage to the source selection line SGS2. In addition, when the operation circuit 120 and 130 supplies a negative voltage of, for example, −10V to the word lines WL0 to WLn and SEL_WLA of the selected memory block, threshold voltage levels of the memory cells may be reduced. Subsequently, the operation circuit 120 and 130 may perform an erase verify operation to detect whether the threshold voltages of the memory cells have decreased to a target level. The above-described erase operation may also be applicable to an erase operation described with reference to FIGS. 8 to 10.

During the read operation, the program operation and the read operation of the selected memory block including the selected memory string ST2_0, the operation circuit may apply a ground voltage to the word lines (such as word lines of unselected memory blocks located above and below the selected memory block) WLB0 to WLBn of the unselected memory blocks.

During the read operation and the program operation of the selected memory block including the selected memory string ST2_0, the operation circuit 120 and 130 may be configured to disconnect memory cells of the unselected memory block located above the selected memory block from the bit lines BLB0 to BLBk and the common source lines SLC_0 to SLC_m. The operating circuit 120 and 130 may be configured to disconnect memory cells of the unselected memory block located below the selected memory block from bit lines BLA0 to BLAk and the common source lines SLB_0 to SLB_m during the read operation and the program operation of the selected memory block including the selected memory string ST2_0.

In addition, during the erase operation of the selected memory block, the operation circuit 120 and 130 may apply a ground voltage to the common source lines SLC_0 to SLC_m of the unselected memory block sharing the bit lines BLB0 to BLBk with the selected memory block including the selected memory string ST2_0 and may apply a positive voltage of, for example, 8V corresponding to the erase voltage Verase to the common source lines SLB_0 to SLB_m of the unselected memory block sharing the common source lines SLB_0 to SLB_m of the selected memory block. Here, the erase voltage Verase may be applied to channels of the memory cells included in the selected memory block in order to perform the erase operation. A negative voltage of, for example, −10V may be applied to the word lines WLA0 to WLAn of the selected memory block.

Since the same operating voltages are applied to an unselected memory block of the first memory block layer 110BL0 sharing the word lines WLA0 to WLAn with the selected memory block of the third memory block layer 110BL2, a disturbance phenomenon may occur in memory cells included in the unselected memory block of the first memory block layer 110BL0. To avoid the disturbance phenomenon, the operation circuit 120 and 130 may couple the memory cells of the unselected memory block to the common source lines SLA_0 to SLA_m during the read operation. As a result, an increase in the voltage difference between the word lines and a channel region in the unselected memory block may be prevented to thereby avoid the disturbance phenomenon occurring in the memory cells of the unselected memory block.

In addition, during the program operation, the operation circuit may precharge the bit lines BLA0 to BLAk of unselected memory blocks included in the first memory block layer 110BL0 to produce channel boosting in the channel region of the memory cells, so that the increase in the voltage difference between the word lines and the channel region in the unselected memory block may be prevented to thereby avoid the disturbance phenomenon occurring in the memory cells of the unselected memory block.

In addition, during the erase operation, the operation circuit 120 and 130 may couple the memory cells of the unselected memory blocks included in the first memory block layer 110BL0 to the common source lines SLA_0 to SLA_m to which the ground voltage is supplied. Thus, the voltage difference between the word lines and the channel region in the unselected memory block may not increase and thereby avoid the disturbance phenomenon occurring in the memory cells of the unselected memory block.

Figure 8:
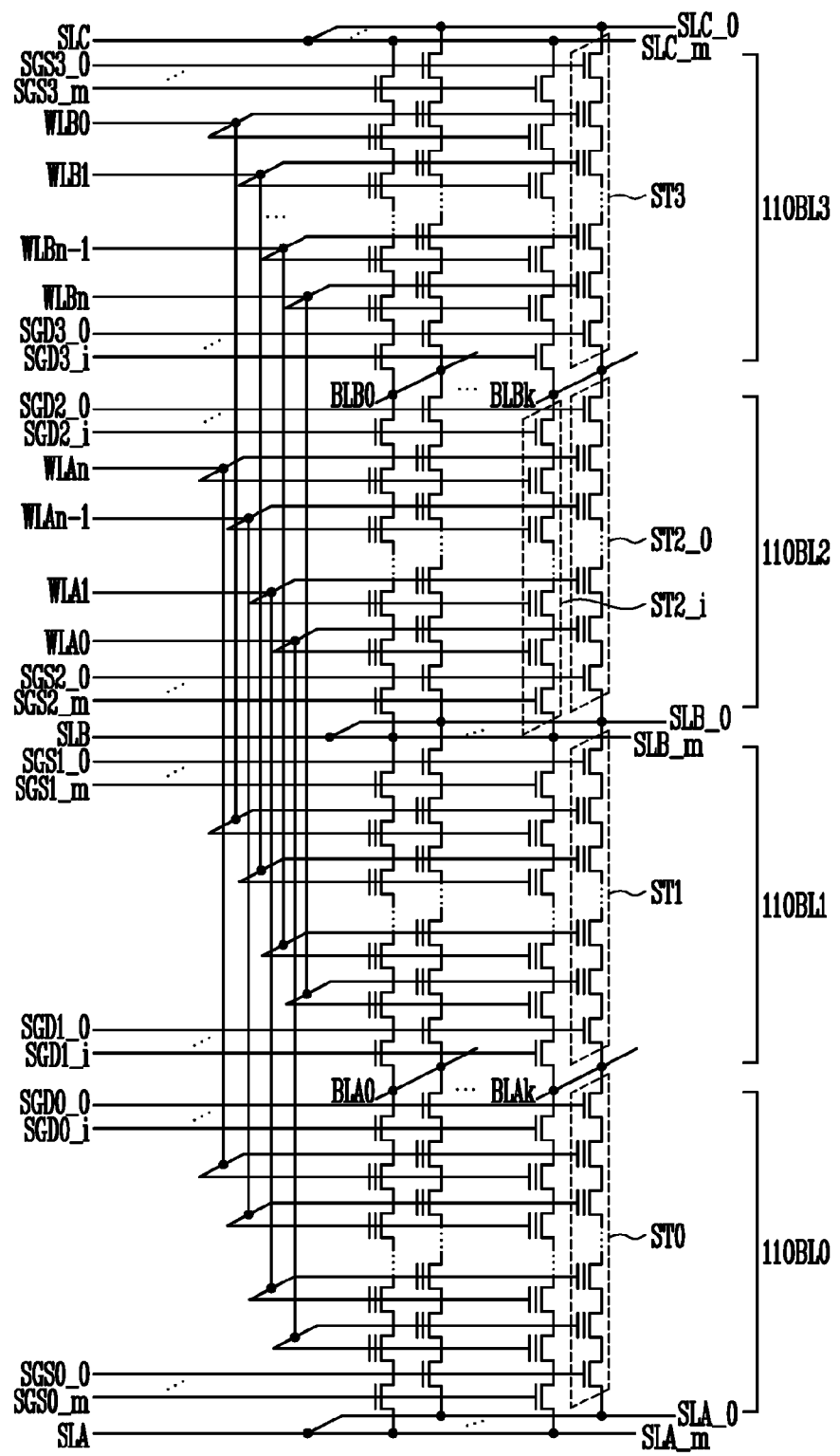
FIG. 8 is a circuit diagram of the structure and operations of a memory array according to another embodiment.

Referring to FIG. 8, common source lines in each memory block, for example, the common source lines SLB_0 to SLB_m, may be coupled to a single common source line SLB, while the first selection lines SGS2_0 to SGS2_m of the memory strings ST2_0 to ST2_i may be separated from one another. Though not illustrated in FIG. 8, the common source line of each memory block, for example, the common source line SLB, may be coupled to the common source lines SLA and SLC of memory blocks located above and below the memory block. In other words, the common source lines SLA, SLB and SLC of vertically arranged memory blocks may be coupled to each other. Therefore, the vertically arranged memory blocks may share a single common source line.

During a read operation, a program operation and an erase operation of memory cells included in the selected memory string ST2_0, in order to improve the disturbance phenomenon of unselected memory blocks, the operation circuit (reference numerals 120 and 130 in FIG. 1) may apply operating voltages to memory blocks as shown in Table 2 below.

TABLE 2

| | | | Read | Program | Erase | | | Read | Program | Erase |
|---|---|---|---|---|---|---|---|---|---|---|
| memory string(ST3) of 4$^{th}$ layer memory block | (sharing WL with ST1) (Sharing BL with ST2_0) | BLBk | 1 V | Vcc->0 V/Vcc | Floating | 4$^{th}$ layer unselected M/B (Sharing BL with ST2_0) | BLBk | 1 V | 0 V/Vcc | Floating |
| | | SGD3_0 | 0 V | 0 V or −2 V | 0 V | | SGD3_0' | 0 V | 0 V or −2 V | 0 V |
| | | WLBn | 0 V | 0 V | 0 V | | WLBn' | 0 V | 0 V | 0 V |
| | | ... | 0 V | 0 V | 0 V | | ... | 0 V | 0 V | 0 V |
| | | WLB | 0 V | 0 V | 0 V | | WLB' | 0 V | 0 V | 0 V |
| | | ... | 0 V | 0 V | 0 V | | ... | 0 V | 0 V | 0 V |
| | | WLB0 | 0 V | 0 V | 0 V | | WLB0 | 0 V | 0 V | 0 V |
| | | SGS3_0 | 0 V | 0 V or −2 V | 0 V or −2 V | | SGS3_0' | 0 V | 0 V | 0 V |
| | | SLC | 0 V | Vcc | Verase(8 V) | | SLC' | 0 V | 0 V | 0 V |
| memory string(ST2_0) of 3$^{rd}$ layer memory block | (selected) | BLBk | 1 V | Vcc->0 V/Vcc | Floating | 3$^{rd}$ layer unselected M/B (sharing BL with ST2-0) | BLBk | 1 V | 0 V/Vcc | Floating |
| | | SGD2_0 | 4 V | 5 V->1.5 V | 0 V | | SGD2_0' | 0 V | 0 V or −2 V | 0 V |
| | | WLAn | Vpass_read | Vpass_pgm | −10 V | | WLAn' | 0 V | 0 V | 0 V |
| | | ... | Vpass_read | Vpass_pgm | −10 V | | ... | 0 V | 0 V | 0 V |
| | | SEL_WLA | Vread | Vpgm | −10 V | | WLA' | 0 V | 0 V | 0 V |
| | | ... | Vpass_read | Vpass_pgm | −10 V | | ... | 0 V | 0 V | 0 V |
| | | WLA0 | Vpass_read | Vpass_pgm | −10 V | | WLA0' | 0 V | 0 V | 0 V |
| | | SGS2_0 | 4 V | 0 V or −2 V | Verase(8 V) | | SGS2_0' | 0 V | 0 V | 0 V |
| | | SLB | 0 V | Vcc | Verase(8 V) | | SLB' | 0 V | 0 V | 0 V |
| memory string(ST1) of 2$^{nd}$ layer memory block | (sharing BL with ST0) (Sharing SL with ST2_0) (sharing WL with ST3) | BLAk | Vcc | Vcc | Floating | 2$^{nd}$ layer unselected M/B | BLAk | Vcc | Vcc | Floating |
| | | SGD1_0 | 0 V | 0 V or −2 V | 0 V | | SGD1_0' | 0 V | 0 V or −2 V | 0 V |
| | | WLBn | 0 V | 0 V | 0 V | | WLBn' | 0 V | 0 V | 0 V |
| | | ... | 0 V | 0 V | 0 V | | ... | 0 V | 0 V | 0 V |
| | | WLB | 0 V | 0 V | 0 V | | WLB' | 0 V | 0 V | 0 V |
| | | ... | 0 V | 0 V | 0 V | | ... | 0 V | 0 V | 0 V |
| | | WLB0 | 0 V | 0 V | 0 V | | WLB0' | 0 V | 0 V | 0 V |
| | | SGS1_0 | 0 V | 0 V or −2 V | 0 V or −2 V | | SGS1_0' | 0 V | 0 V | 0 V |
| | | SLB | 0 V | Vcc | Verase(8 V) | | SLB' | 0 V | 0 V | 0 V |
| Memory string(ST0) of 1$^{st}$ layer memory block | (Sharing WL with ST2_0) (sharing BL with ST1) | BLAk | Vcc | Vcc | Floating | 1$^{st}$ layer unselected M/B | BLAk | Vcc | Vcc | Floating |
| | | SGD0_0 | 4 V | 5 V->0 V or −2 V | 0 V | | SGD0_0' | 0 V | 0 V | 0 V |
| | | WLAn | Vpass_read | Vpass_pgm | −10 V | | WLAn' | 0 V | 0 V | 0 V |
| | | ... | Vpass_read | Vpass_pgm | −10 V | | ... | 0 V | 0 V | 0 V |
| | | WLA | Vread | Vpgm | −10 V | | WLA' | 0 V | 0 V | 0 V |
| | | ... | Vpass_read | Vpass_pgm | −10 V | | ... | 0 V | 0 V | 0 V |
| | | WLA0 | Vpass_read | Vpass_pgm | −10 V | | WLA0' | 0 V | 0 V | 0 V |
| | | SGS0_0 | 0 V | 0 V or −2 V | 0 V or −2 V | | SGS0_0' | 0 V | 0 V | 0 V |
| | | SLA | 0 V | Vcc | Verase(8 V) | | SLA' | 0 V | 0 V | 0 V |
| memory string(ST2_i) of 3$^{rd}$ layer memory block | (sharing WL with ST0) (Sharing BL&WL with ST2_0) | BLBk | 1 V | Vcc->0 V/Vcc | Floating | | | | | |
| | | SGD2_i | 0 V | 5 V->0 V or −2 V | 0 V | | | | | |
| | | WLAn | Vpass_read | Vpass_pgm | −10 V | | | | | |
| | | ... | Vpass_read | Vpass_pgm | −10 V | | | | | |
| | | SEL_WLA | Vread | Vpgm | −10 V | | | | | |
| | | ... | Vpass_read | Vpass_pgm | −10 V | | | | | |
| | | WLA0 | Vpass_read | Vpass_pgm | −10 V | | | | | |
| | | SGS2_m | 4 V | 0 V or −2 V | Verase(8 V) | | | | | |
| | | SLB | 0 V | Vcc | Verase(8 V) | | | | | |

Voltage applying conditions as shown in Table 2 above are described in detail. During the read operation, the program operation and the read operation of the selected memory block including the selected memory string ST2_0, the operation circuit 120 and 130 may apply a ground voltage to the word lines (such as word lines of unselected memory blocks located above and below the selected memory block) WLB0 to WLBn of the unselected memory blocks.

During the read operation and the program operation of the selected memory block including the selected memory string ST2_0, the operation circuit 120 and 130 may block memory cells of the unselected memory block located above the selected memory block from being coupled to the bit lines BLB0 to BLBk and the common source lines SLC_0 to SLC_m and may block memory cells of the unselected memory block located below the selected memory block from being coupled to the bit lines BLA0 to BLAk and the common source lines SLB_0 to SLB_m.

In addition, during the erase operation of the selected memory block, the operation circuit 120 and 130 may apply a ground voltage or a negative voltage, for example, −2V to the first selection lines SGS1_0 to SGS1_m to SGS3_0 to SGS3_m of the unselected memory blocks located above and below the selected memory block and may apply a positive voltage of, for example, 8V corresponding to the erase voltage Verase to the common source lines SLB and SLC of the unselected memory blocks. Here, the erase voltage Verase may be applied to channels of the memory cells included in the selected memory block in order to perform the erase operation. A negative voltage of, for example, −10V may be applied to the word lines WLA0 to WLAn of the selected memory block.

Since the same operating voltages are applied to an unselected memory block of the first memory block layer 110BL0 sharing the word lines WLA0 to WLAn with the selected memory block of the third memory block layer 110BL2, the disturbance phenomenon may occur in memory cells included in the unselected memory block of the first memory block layer 110BL0. To avoid the disturbance phenomenon, the operation circuit may couple the memory cells of the unselected memory block to the common source lines SLA_0 to SLA_m during the read operation. As a result, the voltage difference between the word lines and a channel region in the unselected memory block may not increase, and thereby avoid the disturbance phenomenon occurring in the memory cells of the unselected memory block.

In addition, during the program operation, the operation circuit 120 and 130 may precharge the bit lines BLA0 to BLAk of unselected memory blocks included in the first memory block layer 110BL0 to generate channel boosting in the channel region of the memory cells which are connected to the precharged bit lines BLA0 to BLAk. Thus, the voltage difference between the word lines and the channel region in the unselected memory block may not increase, and thereby avoid the disturbance phenomenon occurring in the memory cells of the unselected memory block.

Figure 9:
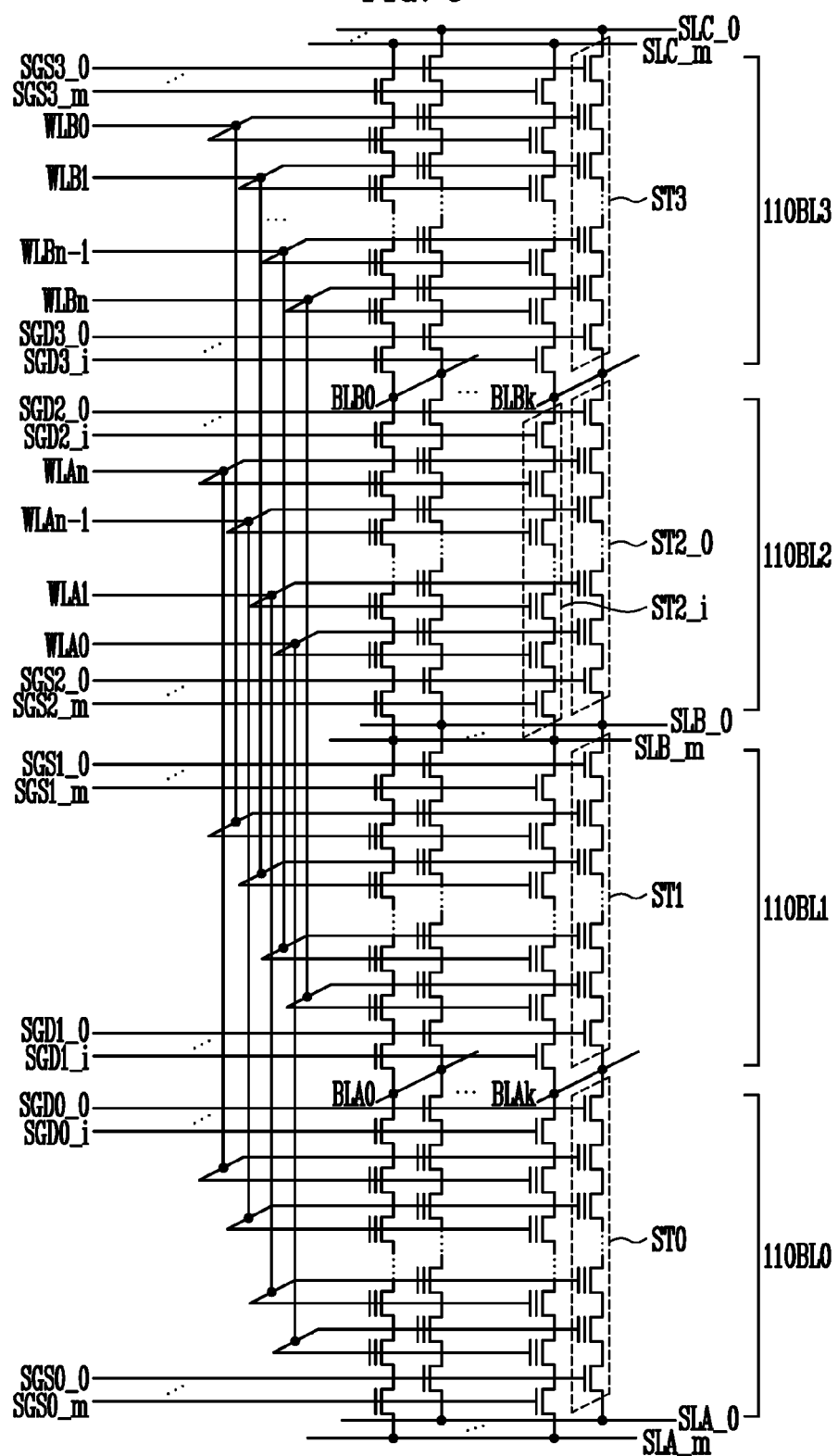
FIG. 9 is a circuit diagram of the structure and operations of a memory array according to another embodiment.

Referring to FIG. 9, common source lines in each memory block, for example, the common source lines SLB_0 to SLB_m, may be separated from one another. The memory strings ST2_0 to ST2_i coupled to the same bit line, for example, the bit line BLB0, may be coupled to the common source lines SLB_0 to SLB_m, respectively. The memory strings ST2_0 to ST2_i coupled to different bit lines BLB0 to BLBk may be coupled to the same common source line. In addition, in each memory block, the memory strings ST2_0 to ST2_i of the first selection lines SGS2_0 to SGS2_m may be separated from one another.

During the read operation, the program operation and the erase operation of the memory cells included in the selected memory string ST2_0, in order to improve the disturbance phenomenon of unselected memory blocks, the operation circuit (reference numerals 120 and 130 in FIG. 1) may be applied to each memory block as shown in Table 3 below.

TABLE 3

| | | | Read | Program | Erase | | Read | Program | Erase |
|---|---|---|---|---|---|---|---|---|---|
| memory string(ST3) of 4$^{th}$ layer memory block | (sharing WL with ST1) (Sharing BL with ST2_0) | BLBk | 1 V | Vcc->0 V/Vcc | Floating | 4$^{th}$ layer unselected M/B (Sharing BL with ST2_0) | BLBk | 1 V | Vcc->0 V/Vcc | Floating |
| | | SGD3_0 | 0 V | 0 V or −2 V | 0 V | | SGD3_0' | 0 V | 0 V or −2 V | 0 V |
| | | WLBn | 0 V | 0 V | 0 V | | WLBn' | 0 V | 0 V | 0 V |
| | | ... | 0 V | 0 V | 0 V | | ... | 0 V | 0 V | 0 V |
| | | WLB | 0 V | 0 V | 0 V | | WLB' | 0 V | 0 V | 0 V |
| | | ... | 0 V | 0 V | 0 V | | ... | 0 V | 0 V | 0 V |
| | | WLB0 | 0 V | 0 V | 0 V | | WLB0 | 0 V | 0 V | 0 V |
| | | SGS3_0 | 0 V | 0 V or −2 V | 0 V or −2 V | | SGS3_0' | 0 V | 0 V | 0 V |
| | | SLC_0 | 0 V | Vcc | 0 V | | SLC_0' | 0 V | 0 V | 0 V |
| memory string(ST2_0) of 3$^{rd}$ layer memory block | (selected) | BLBk | 1 V | Vcc->0 V/Vcc | Floating | 3$^{rd}$ layer unselected M/B (sharing BL with ST2-0) | BLBk | 1 V | Vcc->0 V/Vcc | Floating |
| | | SGD2_0 | 4 V | 5 V->1.5 V | 0 V | | SGD2_0' | 0 V | 0 V or −2 V | 0 V |
| | | WLAn | Vpass_read | Vpass_pgm | −10 V | | WLAn' | 0 V | 0 V | 0 V |
| | | ... | Vpass_read | Vpass_pgm | −10 V | | ... | 0 V | 0 V | 0 V |
| | | SEL_WLA | Vread | Vpgm | −10 V | | WLA' | 0 V | 0 V | 0 V |
| | | ... | Vpass_read | Vpass_pgm | −10 V | | ... | 0 V | 0 V | 0 V |
| | | WLA0 | Vpass_read | Vpass_pgm | −10 V | | WLA0' | 0 V | 0 V | 0 V |
| | | SGS2_0 | 4 V | 0 V or −2 V | Verase(8 V) | | SGS2_0' | 0 V | 0 V | 0 V |
| | | SLB_0 | 0 V | Vcc | Verase(8 V) | | SLB_0' | 0 V | 0 V | 0 V |
| memory string(ST1) of 2$^{nd}$ layer memory block | (sharing BL with ST0) (Sharing SL with ST2_0) (sharing WL with ST3) | BLAk | Vcc | Vcc | Floating | 2$^{nd}$ layer unselected M/B | BLAk | Vcc | Vcc | Floating |
| | | SGD1_0 | 0 V | 0 V or −2 V | 0 V | | SGD1_0' | 0 V | 0 V or −2 V | 0 V |
| | | WLBn | 0 V | 0 V | 0 V | | WLBn' | 0 V | 0 V | 0 V |
| | | ... | 0 V | 0 V | 0 V | | ... | 0 V | 0 V | 0 V |
| | | WLB | 0 V | 0 V | 0 V | | WLB' | 0 V | 0 V | 0 V |
| | | ... | 0 V | 0 V | 0 V | | ... | 0 V | 0 V | 0 V |
| | | WLB0 | 0 V | 0 V | 0 V | | WLB0' | 0 V | 0 V | 0 V |
| | | SGS1_0 | 0 V | 0 V or −2 V | 0 V or −2 V | | SGS1_0' | 0 V | 0 V | 0 V |
| | | SLB_0 | 0 V | Vcc | Verase(8 V) | | SLB_0' | 0 V | 0 V | 0 V |
| Memory string(ST0) of 1$^{st}$ layer memory block | (Sharing WL with ST2_0) (sharing BL with ST1) | BLAk | Vcc | Vcc | Floating | 1$^{st}$ layer unselected M/B | BLAk | Vcc | Vcc | Floating |
| | | SGD0_0 | 4 V | 5 V->0 V or −2 V | 0 V | | SGD0_0' | 0 V | 0 V or −2 V | 0 V |
| | | WLAn | Vpass_read | Vpass_pgm | −10 V | | WLAn' | 0 V | 0 V | 0 V |
| | | ... | Vpass_read | Vpass_pgm | −10 V | | ... | 0 V | 0 V | 0 V |
| | | WLA | Vread | Vpgm | −10 V | | WLA' | 0 V | 0 V | 0 V |
| | | ... | Vpass_read | Vpass_pgm | −10 V | | ... | 0 V | 0 V | 0 V |
| | | WLA0 | Vpass_read | Vpass_pgm | −10 V | | WLA0' | 0 V | 0 V | 0 V |
| | | SGS0_0 | 0 V | 0 V or −2 V | 0 V or −2 V | | SGS0_0' | 0 V | 0 V | 0 V |
| | | SLA_0 | 0 V | Vcc | 0 V | | SLA_0' | 0 V | 0 V | 0 V |
| memory string(ST2_i) | (sharing WL with ST0) | BLBk | 1 V | Vcc->0 V/Vcc | Floating | | | | | |

TABLE 3-continued

|  |  |  | Read | Program | Erase | | Read | Program | Erase |
|---|---|---|---|---|---|---|---|---|---|
| of 3$^{rd}$ layer memory block | (Sharing BL&WL with ST2_0) | SGD2_i | 0 V | 5 V->0 V or –2 V | 0 V | | | | |
| | | WLAn | Vpass_read | Vpass_pgm | –10 V | | | | |
| | | ... | Vpass_read | Vpass_pgm | –10 V | | | | |
| | | SEL_WLA | Vread | Vpgm | –10 V | | | | |
| | | ... | Vpass_read | Vpass_pgm | –10 V | | | | |
| | | WLA0 | Vpass_read | Vpass_pgm | –10 V | | | | |
| | | SGS2_m | 4 V | 0 V or –2 V | Verase(8 V) | | | | |
| | | SLB_m | 0 V | Vcc | Verase(8 V) | | | | |

Voltage applying conditions as shown in Table 3 above are described in detail. During the read operation, the program operation and the read operation of the selected memory block including the selected memory string ST2_0, the operation circuit may apply a ground voltage to the word lines (such as word lines of unselected memory blocks located above and below the selected memory block) WLB0 to WLBn of the unselected memory blocks.

During the read operation and the program operation of the selected memory block including the selected memory string ST2_0, the operation circuit 120 and 130 may block memory cells of the unselected memory block located above the selected memory block from being coupled to the bit lines BLB0 to BLBk and the common source lines SLC_0 to SLC_m and may block memory cells of the unselected memory block located below the selected memory block from being coupled to the bit lines BLA0 to BLAk and the common source lines SLB_0 to SLB_m. During the program operation or the erase operation, the operation circuit may apply a negative voltage, for example, –2V to the first selection lines SGS1_0 to SGS1_m to SGS3_0 to SGS3_m of the unselected memory blocks.

Since the same operating voltages are applied to an unselected memory block of the first memory block layer 110BL0 sharing the word lines WLA0 to WLAn with the selected memory block of the third memory block layer 110BL2, the disturbance phenomenon may occur in memory cells included in the unselected memory block of the first memory block layer 110BL0. To avoid the disturbance phenomenon, the operation circuit may couple the memory cells of the unselected memory block to the bit lines BLA0 to BLAk during the read operation. As a result, the voltage difference between the word lines and a channel region in the unselected memory block may not increase, and thereby avoid the disturbance phenomenon occurring in the memory cells of the unselected memory block.

In addition, during the program operation, the operation circuit 120 and 130 may precharge the bit lines BLA0 to BLAk of unselected memory blocks included in the first memory block layer 110BL0 to generate channel boosting in the channel region of the memory cells. As a result, the increase in the voltage difference between the word lines and the channel region in the unselected memory block may be prevented to thereby avoid the disturbance phenomenon occurring in the memory cells of the unselected memory block.

Figure 10:
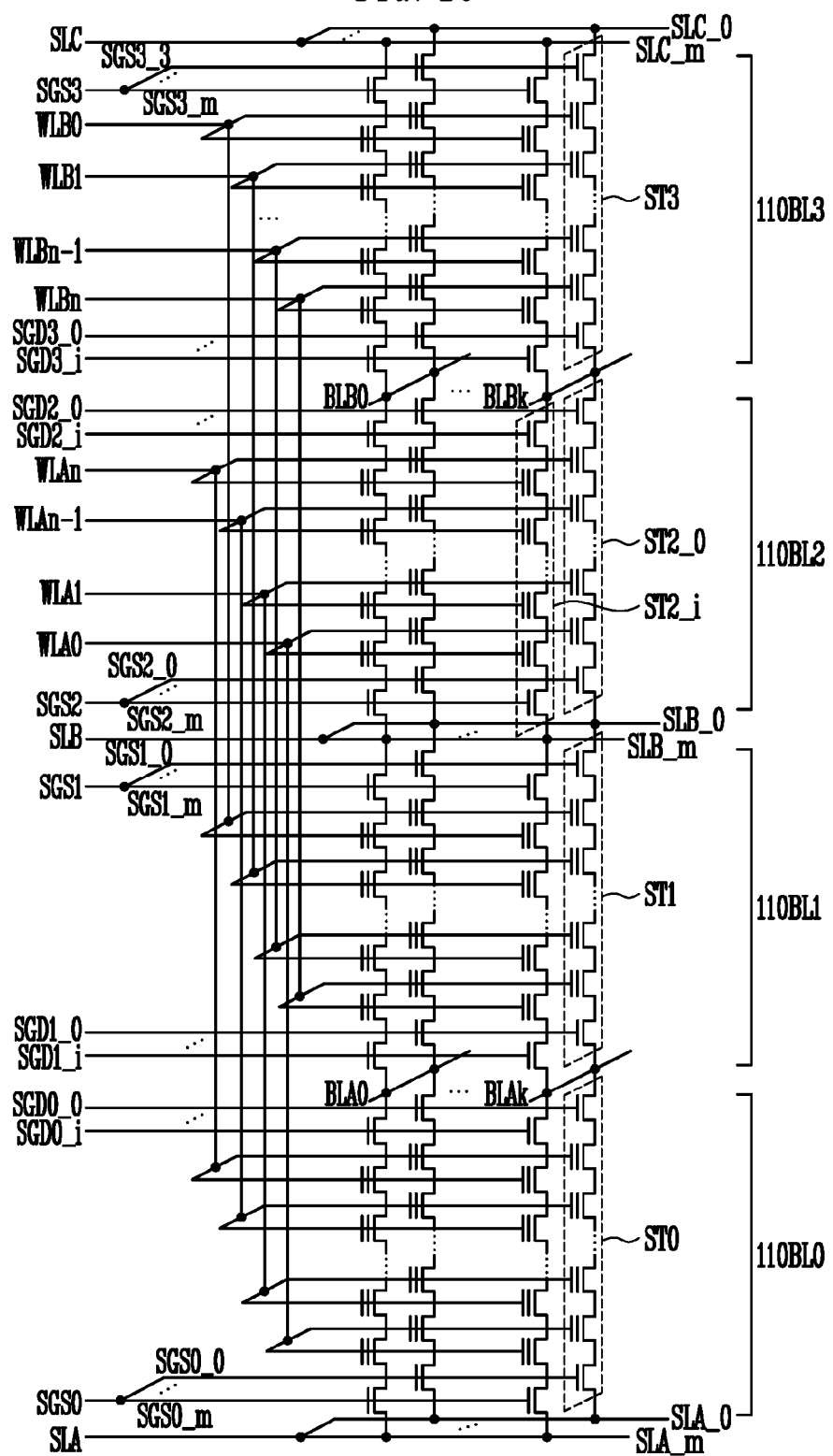
FIG. 10 is a circuit diagram of the structure and operations of a memory array according to another embodiment.

Referring to FIG. 10, in each memory block, the source selection lines SGS0_0 to SGS0_m, SGS1_0 to SGS1_m, SGS2_0 to SGS2_m and SGS3_0 to SGS3_m may be coupled to the source selection lines SGS0, SGS1, SGS2 and SGS3, respectively. Though not shown in FIG. 10, the source selection line in each memory block, for example, the source selection line SGS2, may be coupled to the source selection lines SGS0, SGS1 and SGS3 of memory blocks located above and below the memory block. In other words, the source selection lines SGS0, SGS1, SGS2 and SGS3 of vertically arranged memory blocks may be coupled to one another. Therefore, the vertically arranged memory blocks may share a single source selection line.

In addition, in each memory block, the common source lines SLA_0 to SLA_m, SLB_0 to SLB_m and SLC_0 to SLC_m may be coupled to each other to form the common source lines SLA, SLB and SLC, respectively. Though not shown in FIG. 10, the common source line in each memory block, for example, the common source line SLB, may be coupled to the common source lines SLA and SLC of the memory blocks located above and below the memory block. In other words, the common source lines SLA, SLB and SLC of the vertically arranged memory blocks may be coupled to each other. Therefore, the vertically arranged memory blocks may share a single common source line.

During a read operation, a program operation and an erase operation of the memory cells included in the selected memory string ST2_0, in order to improve the disturbance characteristics of unselected memory blocks, the operation circuit (reference numerals 120 and 130 in FIG. 1) may apply operating voltages to memory blocks as shown in Table 4 below.

TABLE 4

|  |  |  | Read | Program | Erase | | | Read | Program | Erase |
|---|---|---|---|---|---|---|---|---|---|---|
| memory string(ST3) of 4$^{th}$ layer memory block | (sharing WL with ST1) (Sharing BL with ST2_0) | BLBk | 1 V | Vcc->0 V/ Vcc | Floating | 4$^{th}$ layer unselected M/B (Sharing BL with ST2_0) | BLBk | 1 V | Vcc->0 V/ Vcc | Floating |
| | | SGD3_0 | 0 V | 0 V or –2 V | 0 V | | SGD3_0' | 0 V | 0 V or –2 V | 0 V |
| | | WLBn | 0 V | 0 V | 0 V | | WLBn' | 0 V | 0 V | 0 V |
| | | ... | 0 V | 0 V | 0 V | | ... | 0 V | 0 V | 0 V |
| | | WLB | 0 V | 0 V | 0 V | | WLB' | 0 V | 0 V | 0 V |
| | | ... | 0 V | 0 V | 0 V | | ... | 0 V | 0 V | 0 V |
| | | WLB0 | 0 V | 0 V | 0 V | | WLB0 | 0 V | 0 V | 0 V |
| | | SGS3 | 4 V | 0 V or –2 V | Verase(8 V) | | SGS3' | 0 V | 0 V | 0 V |
| | | SLC | 0 V | Vcc | Verase(8 V) | | SLC' | 0 V | 0 V | 0 V |

TABLE 4-continued

| | | | Read | Program | Erase | | | Read | Program | Erase |
|---|---|---|---|---|---|---|---|---|---|---|
| memory string(ST2_0) of 3$^{rd}$ layer memory block | (selected) | BLBk | 1 V | Vcc->0 V/Vcc | Floating | 3$^{rd}$ layer unselected M/B (sharing BL with ST2-0) | BLBk | 1 V | Vcc->0 V/Vcc | Floating |
| | | SGD2_0 | 4 V | 5 V->1.5 V | 0 V | | SGD2_0' | 0 V | 0 V or −2 V | 0 V |
| | | WLAn | Vpass_read | Vpass_pgm | −10 V | | WLAn' | 0 V | 0 V | 0 V |
| | | ... | Vpass_read | Vpass_pgm | −10 V | | ... | 0 V | 0 V | 0 V |
| | | SEL_WLA | Vread | Vpgm | −10 V | | WLA' | 0 V | 0 V | 0 V |
| | | ... | Vpass_read | Vpass_pgm | −10 V | | ... | 0 V | 0 V | 0 V |
| | | WLA0 | Vpass_read | Vpass_pgm | −10 V | | WLA0' | 0 V | 0 V | 0 V |
| | | SGS2 | 4 V | 0 V or −2 V | Verase(8 V) | | SGS2' | 0 V | 0 V | 0 V |
| | | SLB | 0 V | Vcc | Verase(8 V) | | SLB' | 0 V | 0 V | 0 V |
| memory string(ST1) of 2$^{nd}$ layer memory block | (sharing BL with ST0) (Sharing SL with ST2_0) (sharing WL with ST3) | BLAk | 0 V | Vcc | Floating | 2$^{nd}$ layer unselected M/B | BLAk | 0 V | Vcc | Floating |
| | | SGD1_0 | 0 V | 0 V or −2 V | 0 V | | SGD1_0' | 0 V | 0 V or −2 V | 0 V |
| | | WLBn | 0 V | 0 V | 0 V | | WLBn' | 0 V | 0 V | 0 V |
| | | ... | 0 V | 0 V | 0 V | | ... | 0 V | 0 V | 0 V |
| | | WLB | 0 V | 0 V | 0 V | | WLB' | 0 V | 0 V | 0 V |
| | | ... | 0 V | 0 V | 0 V | | ... | 0 V | 0 V | 0 V |
| | | WLB0 | 0 V | 0 V | 0 V | | WLB0' | 0 V | 0 V | 0 V |
| | | SGS1 | 4 V | 0 V or −2 V | Verase(8 V) | | SGS1' | 0 V | 0 V | 0 V |
| | | SLB | 0 V | Vcc | Verase(8 V) | | SLB' | 0 V | 0 V | 0 V |
| Memory string(ST0) of 1$^{st}$ layer memory block | (Sharing WL with ST2_0) (sharing BL with ST1) | BLAk | 0 V | Vcc | Floating | 1$^{st}$ layer unselected M/B | BLAk | 0 V | Vcc | Floating |
| | | SGD0_0 | 0 V | 5 V->0 V or −2 V | 0 V | | SGD0_0' | 0 V | 0 V or −2 V | 0 V |
| | | WLAn | Vpass_read | Vpass_pgm | −10 V | | WLAn' | 0 V | 0 V | 0 V |
| | | ... | Vpass_read | Vpass_pgm | −10 V | | ... | 0 V | 0 V | 0 V |
| | | WLA | Vread | Vpgm | −10 V | | WLA' | 0 V | 0 V | 0 V |
| | | ... | Vpass_read | Vpass_pgm | −10 V | | ... | 0 V | 0 V | 0 V |
| | | WLA0 | Vpass_read | Vpass_pgm | −10 V | | WLA0' | 0 V | 0 V | 0 V |
| | | SGS0 | 4 V | 0 V or −2 V | Verase(8 V) | | SGS0' | 0 V | 0 V | 0 V |
| | | SLA | 0 V | Vcc | Verase(8 V) | | SLA' | 0 V | 0 V | 0 V |
| memory string(ST2_i) of 3$^{rd}$ layer memory block | (sharing WL with ST0) (Sharing BL&WL with ST2_0) | BLBk | 1 V | Vcc->0 V or Vcc | Floating | | | | | |
| | | SGD2_i | 0 V | 5 V->0 V or −2 V | 0 V | | | | | |
| | | WLAn | Vpass_read | Vpass_pgm | −10 V | | | | | |
| | | ... | Vpass_read | Vpass_pgm | −10 V | | | | | |
| | | SEL_WLA | Vread | Vpgm | −10 V | | | | | |
| | | ... | Vpass_read | Vpass_pgm | −10 V | | | | | |
| | | WLA0 | Vpass_read | Vpass_pgm | −10 V | | | | | |
| | | SGS2 | 4 V | 0 V or −2 V | Verase(8 V) | | | | | |
| | | SLB | 0 V | Vcc | Verase(8 V) | | | | | |

Voltage applying operations as shown in Table 4 above are described in detail. During the read operation, the program operation and the read operation of the selected memory block including the selected memory string ST2_0, the operation circuit 120 and 130 may apply a ground voltage to the word lines (such as word lines of unselected memory blocks located above and below the selected memory block) WLB0 to WLBn of the unselected memory blocks.

During the read operation of the selected memory block including the selected memory string ST2_0, the operation circuit 120 and 130 may couple memory cells of the unselected memory block located below the selected memory block to the common source line SLB to which a ground voltage is supplied. The operating circuit 120 and 130 may couple memory cells of the unselected memory block located above the selected memory block to the common source line SLC to which the ground voltage is supplied.

In addition, during the read operation and the program operation of the selected memory block including the selected memory string ST2_0, the operation circuit 120 and 130 may disconnect the memory cells of the unselected memory block located above the selected memory block from the bit lines BLB0 to BLBk and the common source line SLC. The operating circuit 120 and 130 may disconnect memory cells of the unselected memory block located below the selected memory block from the bit lines BLA0 to BLAk and the common source line SLB.

In addition, during the erase operation of the selected memory block including the selected memory string ST2_0, the operation circuit 120 and 130 may apply a positive voltage of, for example, 8V corresponding to the erase voltage Verase to the first selection lines SGS1 and SGS3 and the common source lines SLB and SLC of the unselected memory blocks located above and below the selected memory block. Here, the erase voltage Verase may be applied to channels of the memory cells included in the selected memory block in order to perform the erase operation. A negative voltage of, for example, −10V may be applied to the word lines WLA0 to WLAn of the selected memory block.

Since the same operating voltages are applied to an unselected memory block of the first memory block layer 110BL0 sharing the word lines WLA0 to WLAn with the selected memory block of the third memory block layer 110BL2, a disturbance phenomenon may occur in memory cells included in the unselected memory block of the first memory block layer 110BL0. To avoid the disturbance phenomenon, the operation circuit 120 and 130 may couple the memory cells of the unselected memory block to the common source lines SLA_0 to SLA_m during the read operation. As a result, the voltage difference between the word lines and a channel region in the unselected memory block may not increase, and thereby avoid the disturbance phenomenon occurring in the memory cells of the unselected memory block.

In addition, during the program operation, the operation circuit 120 and 130 may precharge the bit lines BLA0 to BLAk of unselected memory blocks included in the first memory block layer 110BL0 to generate channel boosting in the channel region of the memory cells. Thus, the voltage difference between the word lines and the channel region in the unselected memory block may not increase, and thereby avoid the disturbance phenomenon occurring in the memory cells of the unselected memory block.

Since the memory array is configured as described above, and a read operation, a program operation and an erase operation are performed under voltage conditions selected from among the voltage applying conditions as shown in Tables 1 to 4 above according to the structure of the memory array, more memory cells may be formed within a predetermined area, and disturbance phenomenon of unselected memory cells may be improved.

Figure 11:
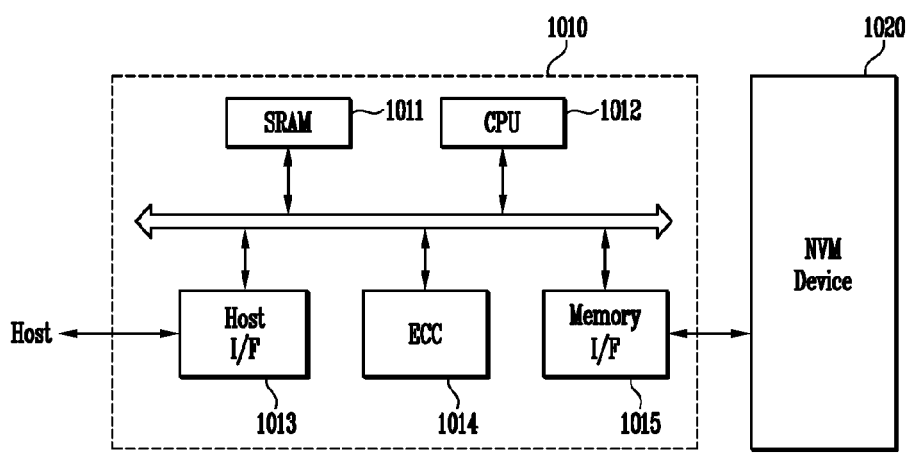
FIG. 11 is a schematic block diagram of a memory system according to an embodiment of the present invention.

Referring to FIG. 11, a memory system 1000 according to an embodiment of the present invention may include a non-volatile memory device 1020 and a memory controller 1010.

The non-volatile memory device 1020 may be configured to include the above-described semiconductor memory device. The memory controller 1010 may be configured to control the non-volatile memory device 1020 in a general operation mode such as a program loop, a read operation or an erase loop.

The memory system 1000 may be a solid state disk (SSD) or a memory card in which the memory device 1020 and the memory controller 1010 are combined. SRAM 1011 may function as an operation memory of a processing unit (CPU) 1012. A host interface 1013 may include a data exchange protocol of a host being coupled to the memory system 1100. An error correction code (ECC) block 1014 may detect and correct errors included in a data read from the non-volatile memory device 1020. A memory interface (I/F) 1015 may interface with the non-volatile memory device 1120. The CPU 1012 may perform the general control operation for data exchange of the memory controller 1110.

Though not illustrated in FIG. 11, the memory system 1100 may further include ROM that stores code data to interface with the host. In addition, the non-volatile memory device 1020 may be a multi-chip package composed of a plurality of flash memory chips. The memory system 1000 may be provided as a storage medium with a low error rate and high reliability. A memory system 1000 such as a Solid State Disk (SSD), on which research has been actively carried out, may include a flash memory device according to an embodiment of the present invention. In this case, the memory controller 1010 may be configured to communicate with the outside (e.g., a host) through one of the interface protocols including USB, MMC, PCI-E, SATA, PATA, SCSI, ESDI and IDE.

Figure 12:
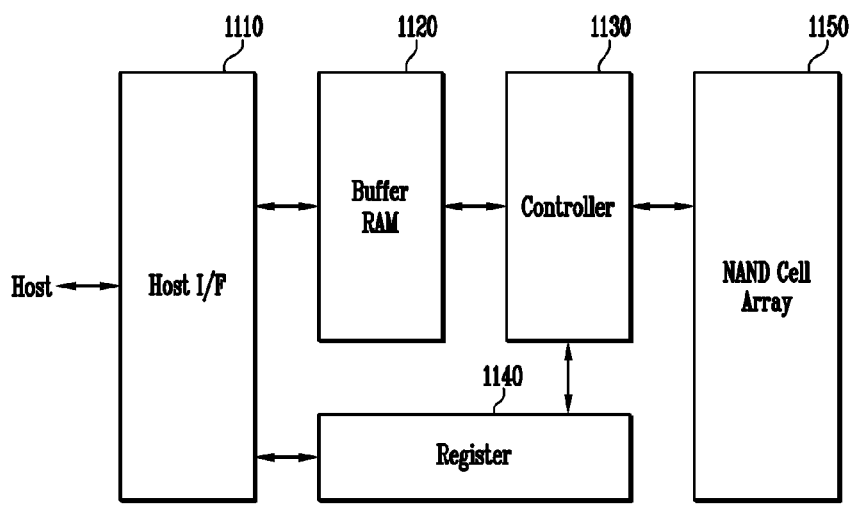
FIG. 12 is a schematic block diagram of a fusion memory device or a fusion memory system configured to perform a program operation according to the aforementioned various embodiments.

Referring to FIG. 12, a OneNAND flash memory device 1100 may include a host interface (I/F) 1110, a buffer RAM 1120, a controller 1130, a register 1140 and a NAND flash cell array 1150. The OneNAND flash memory device 1100 may be used in a fusion memory device.

The host interface 1110 may be configured to exchange various types of information with a device through a different protocol. The buffer RAM 1120 may have built-in codes for driving the memory device or temporarily store data. The controller 1130 may be configured to control read and program operations and every state in response to a control signal and a command that are externally provided. The register 1140 may be configured to store data including instructions, addresses and configurations defining a system operating environment in the memory device. The NAND flash cell array 1150 may be formed of operation circuits including non-volatile memory cells and page buffers. The memory array, as illustrated in FIG. 2, may be used as the memory array of the NAND flash cell array 1150.

Figure 13:
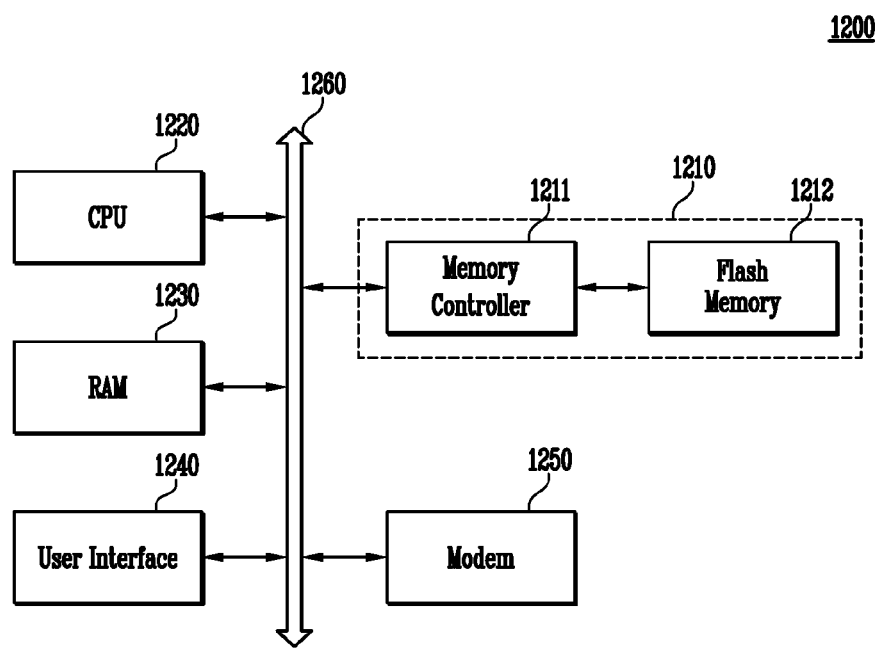
FIG. 13 is a schematic block diagram of a computing system including a flash memory device according to an embodiment of the present invention.

Referring to FIG. 13, a computing system 1200 may include a microprocessor (CPU) 1220, RAM 1230, a user interface 1240, a modem 1250, such as a baseband chipset, and a memory system 1211 that are electrically coupled to a system bus 1260. In addition, if the computing system 1300 is a mobile device, then a battery (not illustrated) may be additionally provided to apply an operating voltage to the computing system 1200. Though not illustrated in FIG. 13, the computing system 1200 may further include application chipsets, a Camera Image Processor (CIS), or mobile DRAM. The memory system 1210 may include a flash memory device 1212 according to the above embodiments. That is, the memory system 1210 may form a Solid State Drive/Disk (SSD) that uses a non-volatile memory to store data. The memory system 1310 may be provided as a fusion flash memory (e.g., OneNAND flash memory).

According to various embodiments of the present invention, more memory cells may be formed within a predetermined area, and deterioration of electrical characteristics caused thereby may be prevented.

What is claimed is:

1. A semiconductor memory device, comprising:
   a memory array configured to include a plurality of memory blocks which are stacked over a substrate;
   first lines configured to electrically couple a plurality of word lines of even-numbered memory blocks to one another; and
   second lines configured to electrically couple a plurality of word lines of odd-numbered memory blocks to one another.

2. The semiconductor memory device of claim 1, wherein the odd-numbered memory blocks are configured to share bit lines with an upper even-numbered memory block which is located above the corresponding odd-numbered memory block and share common source lines with a lower even-numbered memory blocks which is located below the corresponding odd-numbered memory block.

3. The semiconductor memory device of claim 2, wherein the bit lines and the common source lines are arranged in directions crossing each other.

4. The semiconductor memory device of claim 2, wherein the even-numbered memory blocks and the odd-numbered memory blocks are symmetrically stacked in a vertical direction.

5. The semiconductor memory device of claim 1, wherein the plurality of word lines in memory blocks which are arranged in a same plane are electrically separated from one another.

6. The semiconductor memory device of claim 1, wherein each of the memory blocks includes a plurality of memory strings coupled between bit lines and common source lines,
   each of the memory strings comprises memory cells,
   the memory cells are electrically coupled to a common source line in response to a first selection signal, and the memory cells are electrically coupled to a bit line in response to a second selection signal.

7. The semiconductor memory device of claim 6, wherein each of the memory strings further comprises:
- a first selection transistor coupled to the common source line and operating in response to the first selection signal; and
- a second selection transistor coupled to the bit line and operating in response to the second selection signal,
- wherein the memory cells are vertically coupled in series between the first and second selection transistors.

8. The semiconductor memory device of claim 6, wherein memory strings coupled to the same bit line in each memory block are coupled to different common source lines and
- first selection lines arranged in the memory strings which are coupled with the same bit line are electrically coupled to one another,
- wherein the first selection lines are configured to apply the first selection signal.

9. The semiconductor memory device of claim 6, wherein the common source lines in each memory block are coupled to one another, and
- first selection lines of the memory strings are separated from each other,
- wherein the first selection lines are configured to apply the first selection signal.

10. The semiconductor memory device of claim 6, wherein memory strings coupled to the same bit line in each memory block are coupled to different common source lines, and
- first selection lines of the memory strings arranged in the memory strings which are coupled with the same bit line are electrically separated from one another,
- wherein the first selection lines are configured to apply the first selection signal.

11. The semiconductor memory device of claim 6, wherein the common source lines in each memory block are coupled to each other, and
- first selection lines of the memory strings are coupled to each other,
- wherein the first selection lines are configured to apply the first selection signal.

12. A semiconductor memory device, comprising:
- a memory array including a plurality of memory blocks stacked over a substrate, wherein word lines of even-numbered memory blocks which are vertically arranged are coupled to one another, and word lines of odd-numbered memory blocks which are vertically arranged are coupled to each other; and
- an operation circuit configured to select a memory block among the memory blocks, and to apply operating voltages to the memory blocks for a data input/output operation of the selected memory block.

13. The semiconductor memory device of claim 12, wherein the odd-numbered memory block is configured to share bit lines with an upper even-numbered memory block which is located above the corresponding odd-numbered memory block and share common source lines with a lower even-numbered memory block which is located below the corresponding even-numbered memory block.

14. The semiconductor memory device of claim 12, wherein the operation circuit is configured to apply a ground voltage to the word lines of unselected memory blocks located above and below the selected memory block during a program operation, an erase operation or a read operation of the selected memory block.

15. The semiconductor memory device of claim 12, wherein each memory block includes memory strings coupled between bit lines and common source lines,
- each of the memory strings comprises memory cells,
- the memory cells of each of the memory strings are electrically coupled to a common source line through a first selection transistor operating in response to a first selection signal applied to a first selection line, and the memory cells are electrically coupled to a bit line through a second selection transistor operating in response to a second selection signal applied to a second selection line.

16. The semiconductor memory device of claim 15, wherein memory strings coupled to the same bit line in each memory block are coupled to different common source lines, and
- first selection lines of the memory strings which are coupled with the same bit line are coupled to each other.

17. The semiconductor memory device of claim 15, wherein the common source lines in each memory block are coupled to one another, and
- first selection lines of the memory strings are electrically separated from each other.

18. The semiconductor memory device of claim 15, wherein memory strings coupled to the same bit line in each memory block are coupled to different common source lines, and
- first selection lines of the memory strings which are coupled with the same bit line are electrically separated from each other.

19. The semiconductor memory device of claim 15, wherein the common source lines in each memory block are coupled to one another, and
- first selection lines of the memory strings are coupled to one another.

* * * * *